(12) United States Patent
Bright

(10) Patent No.: US 7,186,465 B2
(45) Date of Patent: Mar. 6, 2007

(54) TRANSPARENT CONDUCTIVE OXIDES FOR PLASTIC FLAT PANEL DISPLAYS

(75) Inventor: Clark I. Bright, Tucson, AZ (US)

(73) Assignee: 3M Innovative Properties Company, St. Paul, MN (US)

( * ) Notice: Subject to any disclaimer, the term of this patent is extended or adjusted under 35 U.S.C. 154(b) by 96 days.

(21) Appl. No.: 09/939,008

(22) Filed: Aug. 24, 2001

(65) Prior Publication Data

US 2002/0022156 A1 Feb. 21, 2002

Related U.S. Application Data

(62) Division of application No. 09/419,870, filed on Oct. 18, 1999, now abandoned.

(60) Provisional application No. 60/106,871, filed on Nov. 2, 1998.

(51) Int. Cl.
B32B 27/06 (2006.01)
B32B 27/30 (2006.01)

(52) U.S. Cl. .................. 428/482; 428/522; 428/688; 428/689; 428/697; 428/702; 313/483

(58) Field of Classification Search ............. 428/458, 428/461, 698, 451, 627, 702
See application file for complete search history.

(56) References Cited

U.S. PATENT DOCUMENTS

| | | | |
|---|---|---|---|
| 3,475,307 A | 10/1969 | Knox et al. | |
| 3,607,365 A | 9/1971 | Lindlof | |
| 4,098,965 A | 7/1978 | Kinsman | |
| 4,283,482 A | 8/1981 | Hattori et al. | |
| 4,537,814 A * | 8/1985 | Itoh et al. | 428/217 |
| 4,581,337 A | 4/1986 | Frey et al. | |
| 4,590,118 A | 5/1986 | Yatabe et al. | |
| 4,624,867 A | 11/1986 | Iijima et al. | |
| 4,695,618 A | 9/1987 | Mowrer | |
| 4,710,426 A * | 12/1987 | Stephens | 428/336 |
| 4,799,745 A | 1/1989 | Meyer et al. | 350/1.7 |
| 4,842,893 A | 6/1989 | Yializis et al. | |
| 4,954,371 A | 9/1990 | Yializis | |
| 4,959,257 A | 9/1990 | Mukherjee | 428/156 |
| 4,977,013 A * | 12/1990 | Ritchie et al. | 428/212 |

(Continued)

FOREIGN PATENT DOCUMENTS

DE 196 03746 A1 4/1997

(Continued)

OTHER PUBLICATIONS

International Search Report for Application No. PCT/US99/25843, Feb. 28, 2000.

(Continued)

Primary Examiner—Monique R. Jackson
(74) Attorney, Agent, or Firm—Pamela L. Stewart

(57) ABSTRACT

An electronic device on a plastic substrate, at least one side of the device being protected from reaction with or incorporation of moisture by a composite barrier. The composite barrier may contain, for example, multiple layers of transparent conductive oxide separated by one or more vacuum-evaporated in-situ polymerized organic layers, or may contain multiple barrier layers of transparent conductive oxide, transparent metal, or transparent conductive metal nitride, separated by at least one layer of organic dielectric polymer.

6 Claims, 30 Drawing Sheets

U.S. PATENT DOCUMENTS

| | | | |
|---|---|---|---|
| 5,013,416 A | 5/1991 | Murayama et al. | |
| 5,032,461 A | 7/1991 | Shaw et al. | |
| 5,091,244 A | 2/1992 | Biornard | |
| 5,237,439 A | 8/1993 | Misono et al. | |
| 5,260,095 A | 11/1993 | Affinito | 427/124 |
| 5,354,497 A | 10/1994 | Fukuchi et al. | |
| 5,356,947 A * | 10/1994 | Ali et al. | 522/57 |
| 5,395,644 A | 3/1995 | Affinito | 427/124 |
| 5,427,638 A | 6/1995 | Goetz et al. | |
| 5,440,446 A | 8/1995 | Shaw et al. | 361/301.5 |
| 5,457,356 A | 10/1995 | Parodos | 313/505 |
| 5,510,173 A | 4/1996 | Pass et al. | |
| 5,536,323 A | 7/1996 | Kirlin et al. | |
| 5,547,508 A | 8/1996 | Affinito | 118/50 |
| 5,554,220 A | 9/1996 | Forrest et al. | |
| 5,576,101 A | 11/1996 | Saitoh et al. | |
| 5,607,789 A | 3/1997 | Treger et al. | |
| 5,620,524 A | 4/1997 | Fan et al. | |
| 5,629,389 A | 5/1997 | Roitman et al. | |
| 5,654,084 A | 8/1997 | Egert | |
| 5,681,615 A | 10/1997 | Affinito et al. | |
| 5,681,666 A | 10/1997 | Treger et al. | |
| 5,684,084 A | 11/1997 | Lewin et al. | |
| 5,686,360 A | 11/1997 | Harvey, III et al. | |
| 5,693,956 A | 12/1997 | Shi et al. | |
| 5,699,188 A | 12/1997 | Gilbert et al. | |
| 5,711,816 A | 1/1998 | Kirlin et al. | |
| 5,725,090 A | 3/1998 | Vermillion et al. | 206/320 |
| 5,731,661 A | 3/1998 | So et al. | |
| 5,739,180 A | 4/1998 | Taylor-Smith | 523/203 |
| 5,747,182 A | 5/1998 | Friend et al. | |
| 5,757,126 A | 5/1998 | Harvey, III et al. | 313/506 |
| 5,759,329 A | 6/1998 | Krause et al. | |
| 5,792,550 A | 8/1998 | Phillips et al. | |
| 5,811,177 A | 9/1998 | Shi et al. | |
| 5,811,183 A | 9/1998 | Shaw et al. | |
| 5,821,692 A | 10/1998 | Rogers et al. | |
| 5,844,363 A | 12/1998 | Gu et al. | |
| 5,869,761 A | 2/1999 | Nakamura | |
| 5,872,355 A | 2/1999 | Hueschen | |
| 5,891,554 A | 4/1999 | Hosokawa et al. | |
| 5,902,641 A | 5/1999 | Affinito et al. | 427/255.2 |
| 5,902,688 A | 5/1999 | Antoniadis et al. | |
| 5,904,958 A | 5/1999 | Dick et al. | |
| 5,912,069 A | 6/1999 | Yializis et al. | |
| 5,922,161 A | 7/1999 | Wu et al. | |
| 5,945,174 A | 8/1999 | Shaw et al. | |
| 5,948,552 A | 9/1999 | Antoniadis et al. | |
| 5,965,907 A | 10/1999 | Huang et al. | |
| 5,996,498 A | 12/1999 | Lewis | |
| 6,040,017 A | 3/2000 | Mikhael et al. | |
| 6,045,864 A | 4/2000 | Lyons et al. | |
| 6,066,826 A | 5/2000 | Yializis | |
| 6,083,628 A | 7/2000 | Yializis | |
| 6,092,269 A | 7/2000 | Yializis et al. | |
| 6,106,627 A | 8/2000 | Yializis | |
| 6,118,218 A | 9/2000 | Yializis et al. | |
| 6,146,225 A * | 11/2000 | Sheats et al. | 445/24 |
| 6,146,462 A | 11/2000 | Yializis et al. | |
| 6,198,220 B1 | 3/2001 | Jones et al. | |
| 6,214,422 B1 | 4/2001 | Yializis | |
| 6,231,939 B1 | 5/2001 | Shaw et al. | |
| 6,268,695 B1 | 7/2001 | Affinito | |
| 6,316,343 B1 | 11/2001 | Wada et al. | |
| 6,352,777 B1 * | 3/2002 | Bulovic et al. | 428/411.1 |
| 6,361,885 B1 * | 3/2002 | Chou | 428/690 |
| 6,469,437 B1 | 10/2002 | Parthasarathy et al. | |
| 6,635,989 B1 | 10/2003 | Nilsson et al. | |
| 2003/0184222 A1 * | 10/2003 | Nilsson et al. | 313/512 |

FOREIGN PATENT DOCUMENTS

| | | |
|---|---|---|
| EP | 0 260 626 A2 | 3/1988 |
| EP | 0 340 935 A2 | 11/1989 |
| EP | 0 390 540 B1 | 10/1990 |
| EP | 0 299 753 B1 | 2/1993 |
| EP | 0 547 550 B1 | 6/1993 |
| EP | 0 590 467 B1 | 4/1994 |
| EP | 0 722 787 A2 | 7/1996 |
| EP | 0 722 787 A3 | 7/1996 |
| EP | 0 787 826 A1 | 8/1997 |
| EP | 0 916 394 A2 | 5/1999 |
| EP | 0 916 394 A3 | 5/1999 |
| EP | 0 931 850 A1 | 7/1999 |
| EP | 0 977 469 A2 | 2/2000 |
| JP | 57-159645 | 10/1982 |
| JP | 61-3743 | 1/1986 |
| JP | 61-79644 | 4/1986 |
| JP | 61-277114 | 12/1986 |
| JP | 62217506 | 9/1987 |
| JP | 64-18441 | 1/1989 |
| JP | 4-369 | 1/1992 |
| JP | 4-48515 | 2/1992 |
| JP | 04230906 | 8/1992 |
| JP | 06-136159 A | 5/1994 |
| JP | 06136159 A * | 5/1994 |
| JP | 06251631 | 9/1994 |
| JP | 9059763 A | 3/1997 |
| JP | 09291356 | 11/1997 |
| JP | HEI 10-13083 | 1/1998 |
| WO | WO 87/07848 | 12/1987 |
| WO | WO 92/12219 | 7/1992 |
| WO | WO 95/10117 | 4/1995 |
| WO | WO 97/04885 | 2/1997 |
| WO | WO 97/22631 | 6/1997 |
| WO | WO 98/10116 | 3/1998 |
| WO | WO 98/18852 | 5/1998 |
| WO | WO 99/16557 | 4/1999 |
| WO | WO 99/16931 | 4/1999 |
| WO | WO 00/48749 | 8/2000 |

OTHER PUBLICATIONS

Affinito et al., "A New Method for Fabricating Transparent Barrier Layers," (Thin Solid Films), vol. 290/291, Dec. 15, 1996, pp. 63-67, XP000693807.

Bright, "Sunday C-304 Society of Vacuum Coaters Short Course on Deposition and Properties of ITO and Other Transparent Conductive Coatings," 1998, pp. 1-86.

Bright, "Society of Vacuum Coaters Short Course on Deposition and Properties of ITO and Other Transparent Conductive Coatings (Supplementary Notes)," 1998, pp. 1-36.

Shaw et al., "A New Vapor Deposition Process for Coating Paper and Polymer Webs," Oct. 1992, pp. 18-24.

Shaw et al., "A New High Speed Process for Vapor Depositing Acrylate Thin Films: An Update," Society of Vacuum Coaters 36th Annual Technical Conference (1993), pp. 348-352.

Shaw et al., "Use of Vapor Deposited Acrylate Coatings to Improve the Barrier Properties of Metallized Film," Society of Vacuum Coaters 37th Annual Technical Conference (1994), pp. 240-247.

Affinito et al., "Polymer-Oxide Transparent Barrier Layers," 1996 Society of Vacuum Coaters 39th Annual Technical Conference (1996), pp. 392-397.

Chatham, *Surface & Coatings Technolgy 78*, "Review Oxygen Diffusion Barrier Properties of Transparent Oxide Coatings on Polymeric Substrates," (1996), pp. 1-9.

Gilbert et al., "Comparison of ITO Sputtering Process from Ceramic and Alloy Targets onto Room Temperature PET Substrates," Society of Vacuum Coaters, 36th Annual Technical Conference (1993), pp. 236-241.

Macleod, *Thin-Film Optical Filters*, Macmillan Publishing Co., Second Edition, "Antireflection Coatings," (1986), pp. 71-77.

Shaw et al., "Use of Evaporated Acrylate Coatings to Smooth the Surface of Polyester and Polypropylene Film Substrates," Rad Tech (1996), (12 pages).

A.S. da Silva Sobrinho et al., "Transparent Barrier Coatings on Polyethylene Terephthalate by Single-and Dual-Frequency Plasma-Enhanced Chemical Vapor Deposition," J. Vac. Sci. Technol. A 16(6), Nov./Dec. 1998, pp. 3190-3198.

Wahab Baouchi et al., "Comparison of Non-Reactive and Reactive ITO Sputtering in a High Volume Production Environment," SID 1995 Conference, pp. 89-90.

Mc-Graw-Hill Multimedia Encyclopedia of Science & Technology, "Liquid Crystals," (1998), pp. 1-5.

McGraw-Hill Multimedia Encyclopedia of Science & Technology, "Electronic Display," (1998), pp. 1-8.

McGraw-Hill Multimedia Encyclopedia of Science & Technology, "Electroluminescence," (1998), pp. 1-3.

McGraw-Hill Multimedia Encyclopedia of Science & Technology, "Sputtering," (1998), pp. 1-3.

McGraw-Hill Multimedia Encyclopedia of Science & Technology, "Printed Circuit," (1998), pp. 1-13.

McGraw-Hill Multimedia Encyclopedia of Science & Technology, "Light-Emitting Diode," (1998), pp. 1-3.

O'Mara, *Liquid Crystal Flat Panel Displays*, Manufacturing Science & Technology, 1993), Van Nostrand Reinhold Publishing, New York, pp. 21-35, 66-70, 73, 93, 96, 116-117, 123-125, 144-145, 149-150, and 165-175.

Vossen et al., *Thin Film Processes II*, (1991), Academic Press, Inc., San Diego, Calif., Chapter II-2, pp. 79-132; Chapter II-4, pp. 177-208; Chapter II-5, pp. 209-280; Chapter IV-1, pp. 525-564.

Barnes et al., "Advanced Materials for Electronic Applications by Polymerization of Cyclic Olefins Using Late Transition Metal Catalysts," Jun. 1998, pp. 1-13.

Bunshah et al., "Deposition Technologies for Films and Coatings, Developments and Applications," Noyes Publications, (1982), New Jersey, Chapter 5, pp. 170-243; Chapter 6, pp. 244-287; Chapter 8, pp. 335-364; and Chapter 9, pp. 365-384.

Yamada et al., "The Properties of a New Transparent and Colorless Barrier Film," (1995), 38th Annual Technical Conference Proceedings, 1995 Society of Vacuum Coaters, pp. 28-29.

Heil, "Mechanical Properties of PECVD Silicon-Oxide Based Barrier Films on PET," (1995), 38th Annual Technical Conference Proceedings, 1995 Society of Vacuum Coaters, p. 33.

Lohwasser et al., "Electron-Beam Oxide Coating on Plastic Films for Packaging, Development, Production and Application," (1995), 38th Annual Technical Conference Proceedings, 1995 Society of Vacuum Coaters, pp. 40-41.

Comer, "The Impact of Visual Anomalies on the Barrier Properties of Metallized Biaxially Oriented Polypropylene Film," (1995), 38th Annual Technical Conference Proceedings, 1995 Society of Vacuum Coaters, pp. 59-60.

Knoll et al., "Effects of Process Parameters on PECVD Silicon Oxide and Aluminum Oxide Barrier Films," (1995), 38th Annual Technical Conference Proceedings, 1995 Society of Vacuum Coaters, pp. 425-426 and 430.

Misiano et al., "Inexpensive Transparent Barrier Coatings on Plastic Substrates," (1996), 39th Annual Technical Conference Proceedings, 1996 Society of Vacuum Coaters, pp. 413 and 399.

Langowski, "Transparent Barrier Coatings for Flexible Packagings: Industrial and Research Activities in Germany," (1996), 39th Annual Technical Conference Proceedings, 1996 Society of Vacuum Coaters, pp. 398 and 415.

Affinito, J. D. et al., "*Ultrahigh Rate, Wide Area, Plasma Polymerized Films From High Molecular Weight/Low Vapor Pressure Liquid or Solid Monomer Precursors*", J. Vac. Sci. Technol. A 17 (4), Jul./Aug. 1999, pp. 1974-1981.

Affinito, J. D. et al., "*Ultra High Rate, Wide Area, Plasma Polymerized Films from High Molecular Weight/Low Vapor Pressure Liquid or Solid Monomor Precursors*", 45th International Symposium of the American Vacuum Society, Nov. 6, 1998, pp. 0-26.

Affinito, J. D. et al., "*Vacuum Deposited Conductive Polymer Films*", The Eleventh International Conference on Vacuum Web Coating, Nov. 9-11, 1997, pp. 0-12.

Affinito, J. et al., "*Vacuum Deposited Polymer/Metal Multilayer Films for Optical Application*", Thin Solid Films 270 (1995) pp. 43-48.

Affinito, J. D. et al., "*Molecularly Doped Polymer Composite Films for Light Emitting Polymer Aplications Fabricated by the PML Process*", 41st Annual Technical Conference Proceedings (1998), pp. 220-225.

Chahroudi, D. et al., "*Transparent Glass Barrier Coating for Flexible Film Packaging*", Society of Vacuum Coaters 505/298-7624, 34th Annual Technical Conference Proceedings (1991), pp. 130-133.

Shi, M. K. et al., "In-Situ and Real-Time Monitoring of Plasma-Induced Etching of PET and Acrylic Films", *Plasmas and Polymers*, vol. 4, No. 4 (1999). pp. 1-12.

Shi, M. K. et al., "Plasma Treatment of PET and Acrylic Coating Surfaces: I. In-Situ XPS Measurements", *Journal of Adhesion Science and Technology*, vol. 14, No. 12, (2000), pp. 1-28.

Tropsha, y. G. et al., "*Activated Rate Theory Treatment of Oxygen and Water Transport Through Silicon Oxide/Poly(ethylene terephthalate) Composite Barrier Structures*", J. Phys. Chem. B, vol. 101, No. 13, (1997), pp. 2259-2266.

Tropsha, Y. G. et al., "*Combinations Barrier Effect of the Multilayer SiO$_x$Coatings on Polymer Substrates*", Society of Vacuum Coaters, 40th Annual Technical Conference Proceedings (1997), pp. 64-69.

Letters: Affinito, letter to Peter Erickson re: transmittal of literature, May 9, 1997, with an Affinito letter providing an overview of the content of the collection of literature concerning Battelle Pacific Northwest National Laboratory's PML and LML technology for the vacuum deposition of polymer films, May 5, 1997, 4 pages.

Publication: Affinito, "Addendum to Attached White Paper on Polymer Multilayer Thin Film Deposition Technology," Mar. 9, 1993, pp. 1-5.

Publication: Affinito, "Application of PNL$^{,s}$ PML Technology to Electrolyte and Advanced Battery Fabrication," Battelle Pacific Northwest Laboratories, Apr. 25, 1994, pp. 1-4.

Paper: Affinito, "Extremely High Rate Deposition of Polymer Multilayer Optical Thin Film Materials," Battelle Pacific Northwest Laboratory, Jan. 4, 1991, 48 pages.

Gustafsson et al., "Flexible Light-Emitting Diodes Made From Soluble Conducting Polymers," *Nature*, vol. 357, Jun. 11, 1992, pp. 477-479.

Affinito et al., "PML/Oxide/PML Barrier Layer Performance Differences Arising From Use of UV or Electron Beam Polymerization of the PML Layers," *Thin Solid Films*, 308-309, (1997), pp. 19-25.

Inoue et al., "Fabrication of a Thin Film of MNA by Vapour Deposition," *Proc.Jpn. Congr. Mater. Res.*, vol.33, (1990), pp. 177-179.

Penning, *Electrical Discharges in Gases*, Gordon and Breach, Science Publishers, (1965), Chapters 5-6, pp. 19-35; and Chapter 8, pp. 41-50.

Affinito et al., "High Rate Vacuum Deposition of Polymer Electrolytes," *J. Vac. Scie. Technol.*, A 14(3), May/Jun. 1996, pp. 733-738.

Affinito et al., "Vacuum Deposition of Polymer Electrolytes on Flexible Substrates," Proceedings of the Ninth International Conference on Vacuum Web Coating, Nov. 1995, ed. R. Bakish, Bakish Press 1995, pp. 20-36.

Affinito et al., "Comparison of Surface Treatments of PET and PML," SVC 40th Annual Technical Conference—Paper No.: W-05, Proceedings of the Society of Vacuum Coaters, Vacuum Web Coating Session, (1997), 4 pages.

Vossen et al., "Glow Discharge Sputter Depostion," *Thin Film Processes*, Academic Press, Chapter II-1, (1978), pp. 12-63.

Hollahan et al., "Plasma Deposition of Inorganic Thin Films," *Thin Film Processes*, Academic Press, Chapter IV-1, (1978), pp. 335-360.

Yasuda, "Glow Discharge Polymerization," *Thin Film Processes*, Academic Press, Chapter IV-2, (1978), pp. 361-397.

International Search Report for Application No. PCT/US99/29853, Publication No. WO 00/36665, Jun. 22, 2000.

Proposal: Affinito et al., "A New Technique for Fabrication of Nonlinear Optical Polymer Thin Films and a Cost Effective Fabrication Method for Nonlinear Optical Waveguides," FY97 Laboratory Directed Research and Development Proposal, 1997, pp. 1-4.

Proposal: Affinito et al.m "Electrochromic Oxides for Wide Area Switchable Camouflage, Windows, and Mirrors," FT97 IR&D Investment Proposal, Material Sciences Department/EMSL, Feb. 2, 1997, pp. 1-6.

Paper: Affinito et al., "Vacuum Deposited Polymer/Metal Films for Optical Applications," Paper No. C1.13, Battelle Pacific Northwest Laboratory, Apr. 1995, pp. 1-14.

Paper: Affinito et al., "Vacuum Deposition of Polymer Electrolytes on Flexible Substrates," The Ninth International Conference on Vacuum Web Coating, Battelle Pacific Northwest Laboratory, 1995, pp. 0-16.

Paper; Affinito et al., "Polymer/Polymer, Polymer/Oxide, and Polymer/Metal Vacuum Deposited Interference Filters," Tenth International Vacuum Web Coating Conference, Battelle Pacific Northwest Laboratory, 11/10-12, 1996, pp. 0-14.

Paper: Affinito et al., "PML/Oxide/PML Barriers Layer Performance Differences Arising from Use of UV or Electron Beam Polymerization of the PML Layers," ICMCTF97 Conference, Paper No. C1.11, Battelle Pacific Norhtwest Laboratory, Apr. 21-25, 1997, pp. 0-18.

Paper; Affinito, "Using Lateral Force Microscopy as a Means to Obtain Information about Pinhole Formation in $Al_2O_3$ Barrier Layers Deposited on PET," May 5, 1997, 4 pages.

Paper: Affinito et al., "Polymer-Oxide Transparent Barrier Layers,"SVC 39th Annual Technical Conference, Paper No. W-12, 1996, pp. 1-6.

Paper; Affinito et al., "Comparison of Surface Treatments of PET and PML," SVC 40th Annual Technical Conference, Paper No. W-05, Pacific Northwest National Laboratory, date unknown, 1997, pp. 1-6.

Affinito et al., "Vacuum deposited polymer/silver reflector material", *SPIE*, vol. 2262, pp. 276-283, Jul. 1994.

Paper: Affinito, *"Batelle Coating Capabilities and Experience"*, Battelle Pacific Northwest Laboratories, 5 pages, 1994.

Proposal: Affinito: *"Li-Polymer Batteries Fabricated with New Materials and new Processing Technology, with Greater than 1200 WHr/l Capacity"*, Proposal Response to BAA 94-1, Battelle Pacific Northwest Laboratory, pp. 1-21, Jan. 1994.

Proposal: Affinito et al., *"Low Cost Wide Area Light Emitting polymer Device Fabrication with PML and LML Process Technology"*, Battelle Pacific Northwest National Laboratory, pp. 1-19 (Technical Proposal); pp. 1-3 (Facilities) Aug. 1996.

* cited by examiner

TRANSPARENT CONDUCTIVE OXIDES FOR PLASTIC FLAT PANEL DISPLAYS

CROSS-REFERENCE TO RELATED APPLICATIONS

This application is a divisional of U.S. patent application Ser. No. 09/419,870 filed Oct. 18, 1999, now abandoned, which in turn claims the benefit of U.S. Provisional Application No. 60/106,871, filed Nov. 2, 1998, the disclosures (including appendices) of which are incorporated herein by reference. Further, this application incorporates by reference the content of the following: U.S. Pat. No. 5,440,446, issued Aug. 8, 1995, U.S. Pat. No. 5,725,909, issued Mar. 10, 1998, U.S. patent application Ser. No. 08/706,180, filed Aug. 30, 1996 (now U.S. Pat. No. 6,231,939), and U.S. patent application Ser. No. 08/741,609, filed Oct. 31, 1996 (now abandoned, and refiled as a continuation on Nov. 26, 2003, as U.S. patent application Ser. No. 10/723,321).

FIELD OF THE INVENTION

This invention relates to composite substrates for flat panel displays (FPDs), packaging materials and light sources (electro luminescence lamps) comprising a plastic substrate having thin film barrier and conductive layers, in particular, multiple thin alternating layers of metallic film, transparent conductive oxide (TCO), metal nitride, and organic polymers deposited over the plastic substrate.

BACKGROUND OF THE INVENTION

The use of portable electronic devices incorporating flat panel displays is prevalent and increasing rapidly. Because of the portable nature of these devices, it is desired to minimize both the size and weight and maximize durability. The display portion of the device is generally larger and denser as compared to the rest of the device, and is manufactured on glass substrates. Accordingly, a smaller, lighter and more durable portable electronic device is most effectively achieved with a smaller, lighter and shatterproof electronic device display.

Despite being lightweight, plastic has not been considered a viable substrate material to be used for the manufacture of flat panel displays for multiple reasons. Most importantly, flat panel displays fabricated with plastic substrates tend to fail prematurely due to degradation of display medium (display matrix) and/or metallic electrodes. In particular, the display medium and some metallic electrodes become degraded when atmospheric oxygen and water vapor permeate the substrate and chemically degrade the active portion of the display matrix which is generally comprised of liquid crystals and/or light emitting devices. In addition, common optical quality plastic substrates, e.g. polyethylene terephthalate (PET), have limited thermal properties. In particular, there is a limited temperature range that allows useful optical quality (e.g. clarity, transparency, and uniform index of refraction) to be maintained, while maintaining the substrate's mechanical strength and properties.

SUMMARY OF THE INVENTION

The present invention is directed to the fabrication of flat panel displays on lightweight, flexible, plastic substrates. Because plastic substrates for FPDs are flexible, smaller and lighter than glass substrates, the electronic device with the plastic FPD is more portable, space-efficient and light-weight. In addition, electroluminescent and organic light emitting devices fabricated on flexible polymeric substrates in a coating process have lower manufacturing costs than those with glass substrates, and improved ruggedness.

A display medium of the flat panel display is sandwiched between two electrode layers. At least one of the electrodes is transparent for viewing of the display. The display medium is protected from oxidative or moisture degradation. In the present invention, at least one layer, having both barrier characteristics and the ability to function as an electrode, is deposited over the substrate. In particular, the layer has both low oxygen and water vapor permeability, and a low enough resistivity to function as an electrode for the display. For lower permeability and/or higher conductivity, multiple alternating layers of barrier materials and conductive materials are applied. In an alternative embodiment, the conductive layers (e.g. transparent conductive oxide layers) are in direct electrical contact. The barrier material includes at least one of an organic polymer, a transparent dielectric, a transparent metal nitride and/or a transparent conductive oxide. The conductive material includes at least one of a thin transparent conductive oxide, a thin transparent metallic film and/or a metal nitride.

Using a smoothing base coat layer over the plastic substrate imparts good optical quality throughout the substrate layers and provides a pristine surface for nucleation of the deposited barrier or conductive layer, e.g. TCO. The pristine surface smoothes over any surface roughness of the plastic substrate, thereby adding to the FPD lifetime and optical quality. Additionally, a hardcoat layer is applied over the substrate in lieu of or in addition to the smoothing basecoat layer.

The various described organic layers may be applied by many well known non-vacuum liquid coating processes, e.g. preferably by Gravure, or fabricated through a vacuum coating technique, e.g., preferably by a polymer multilayer (PML) coating process. Related desirable coating processes are disclosed in U.S. Pat. Nos. 5,547,508, 5,395,644, 5,260,095, U.S. patent application Ser. No. 08/939,594, filed Sep. 29, 1997, entitled "Plasma enhanced chemical deposition with low vapor pressure compounds", now U.S. Pat. No. 6,224,948 and herein incorporated by reference, Thin Film Processes II, chapters II-2, 4, 5, and IV-1, edited by John L. Vossen and Wermer Kern, Academic Press, 1991, ISBN 0-12-728251-3, and Deposition Technologies for Films and Coatings, Developments and Applications, Rointan F. Bunshah et al., Chapters 5, 6, 8 and 9, Noyes Publications, 1982, ISBN 0-8155-0906-5.

The vacuum evaporation PML process may be used to deposit organic monomers over the plastic substrate. The organic monomer is then polymerized in-situ by electron beam or UV radiation. The PML process is compatible with physical vapor deposition processes for layers such as TCO layers. Both processes are carried out in combined sequences within a properly designed single vacuum chamber. However, multiple vacuum chambers may be used.

The PML deposited organic polymer layer is used to produce substrate surface smoothing and improve barrier coatings in the multilayer structure. The benefit of a smooth substrate surface is that there is a clean surface for adhesion, nucleation, and growth of a deposited conductive layer, e.g. a TCO. Additionally, a PML deposited organic polymer layer provides protection of an underlying barrier layer in order to minimize holes or other defects in the layer so that there is low permeability.

Neither a single layer barrier coating with a metal oxide layer such as thin film dielectric coatings of alumina or silica or other certain metal oxides, nor a plastic flat panel display with a thick metallic film layer having an optical density of greater than 2.0, renders low enough permeability for the processing and manufacture of plastic flat panel displays with acceptable lifetimes. Even where multiple layers of dielectrics, metals or the combination thereof are used, the improvement in performance is minimal. In order to provide barrier properties sufficient for optical quality plastic flat panel displays, a transparent dielectric barrier, such as $SiO_{2-x}$ or $Al_2O_{3-y}$, is deposited over a plastic substrate. When dielectric layers are combined with PML deposited organic polymer layers, outstanding barrier properties are achieved on flexible plastic substrates. Alternatively to the dielectric layer, a barrier coating of ITO (called "indium tin oxide", which is actually "tin doped indium oxide," a mixture of indium oxide and tin oxide) or another TCO barrier is deposited over the substrate. In yet another alternative embodiment, both TCO barrier layers and PML processed organic polymer layers are deposited over the plastic substrate. Moreover, in yet another alternative, both TCO barrier layers with PML processed organic polymer layers and the transparent dielectric barrier layers are deposited over the plastic or polymeric substrate. Multilayer structures of such organic and inorganic layers deposited over a plastic substrate exhibit significantly improved barrier properties as compared to inorganic, organic, or metallic layers alone.

In an embodiment, a PML processed top coat polymer layer is applied before the previously deposited layer contacts a surface, such as a roller, thereby protecting the previously deposited layer. The PML processed top coat greatly enhances the exclusion of moisture (water vapor) and atmospheric gases that chemically degrade the display medium and decrease the device performance, even though the polymer topcoat is not, itself, a good barrier material.

Metal oxide dielectric barriers have previously been deposited by evaporation, sputtering, and chemical vapor deposition processes onto glass substrates. However, for achieving metal oxide thin films with bulk material-like properties on glass substrates, a high temperature deposition method is used, which would melt the plastic substrate, thereby negatively impacting the mechanical properties of the plastic substrate. In the present invention, the PML process used for depositing an organic dielectric does not require such high temperatures and therefore does not significantly alter the mechanical properties of the plastic substrate. However, organic polymer layers alone do not provide substantial barrier properties, particularly against water vapor.

When TCOs are deposited at low temperatures to accommodate the thermal and mechanical limits of the substrate, for example, by magnetron sputtering, electron-beam evaporation or plasma enhanced chemical vapor deposition (PECVD), the subsequent TCO coatings have less than bulk conductivity, i.e. low overall levels of conductivity. TCO films with a larger thickness deposited through these methods achieve acceptable conductive levels for portable electronic devices. However, these thick films of TCO are subject to cracking, crazing and, in some instances, delamination from the substrate, especially when they are processed by a heat treatment step or a coating process involving mechanical rollers (e.g. web coating). Accordingly, the TCO coating is deposited in a series of thin, separated layers, yet still maintains high conductive levels. Multiple thin layers of TCO avoid the problems associated with thicker layers, and advantageously are electrically connected in parallel to provide adequate electrical performance characteristics.

The thin layers of TCO are preferably separated by layers deposited using the PML process, which leads to improved optical, electrical and mechanical performance. Superior surface properties (low surface roughness, and high optical quality), barrier properties (low vapor permeability) and mechanical properties result when TCO coatings are deposited by magnetron sputtering on a plastic substrate in combination with the PML process, e.g., by providing hydrogen in the plasma of the vacuum chamber used in the sputtering process of the TCO. Preferably, moderate annealing temperature conditions are used for TCO deposition. For example, the resistivity of ITO is a function of the oxygen and tin content, as well as the deposition conditions (e.g., temperature). Low temperature depositions yield high resistivity ITO layers. A low resistivity for the ITO layers is desired. The resistivity of ITO decreases with a thicker TCO layer. But as discussed previously, thick TCO layers are prone to cracking or crazing. Multiple thin layers of TCO, as described in the present invention, will not crack and will yield a lower resistivity. Moreover, the surface resistivity of a thin film of TCO in multiple layers is low for a given total film thickness, due to its improved microstructure.

In a first embodiment of the present invention, a polymer smoothing coating is deposited over the substrate. The smoothing coating is applied by a PML process or liquid coating. A TCO, metal nitride, or metal layer is then deposited over the smoothing layer. Additionally, multiple alternating layers of a protective polymer layer and an additional TCO, metal nitride, or metal layer are deposited. Preferably, the alternating layers are of the same material, e.g. TCO/polymer/TCO, etc.

In a second embodiment, multiple alternating layers of polymer layers and metal oxide or metal nitride are deposited over the substrate or a polymer smoothing coating layer. A TCO layer is then deposited over the top of multiple alternating layers. These multiple alternating layers together with the TCO have adequate barrier and conductivity characteristics.

In a third embodiment, a substrate is coated with a TCO layer, a metal coating, and another TCO layer. This three layer configuration is called "optically enhanced metal" and has similar characteristics as a single TCO layer. With the optically enhanced metal good conductivity, optical transmission and barrier properties are achieved. A metal nitride layer may be substituted for one or more of the metal coating or TCO layers in the optically enhanced metal configuration. For example, an optically enhanced metal configuration may be made from a TCO layer, a conductive metal nitride layer and another TCO layer, or from a silicon nitride layer, a metal layer and another metal nitride layer.

In a fourth embodiment, a substrate is alternatively coated with an inorganic layer (such as TCO, metal nitride, or dielectric metal oxides), and polymer layers to provide both barrier and conductive properties.

BRIEF DESCRIPTION OF THE DRAWING

The aspects of the present invention described above in summary and below in more detail as well as various advantageous aspects will become appreciated as the same becomes better understood with reference to the specification, claims and drawings wherein:

DETAILED DESCRIPTION OF THE INVENTION

Figure 1:
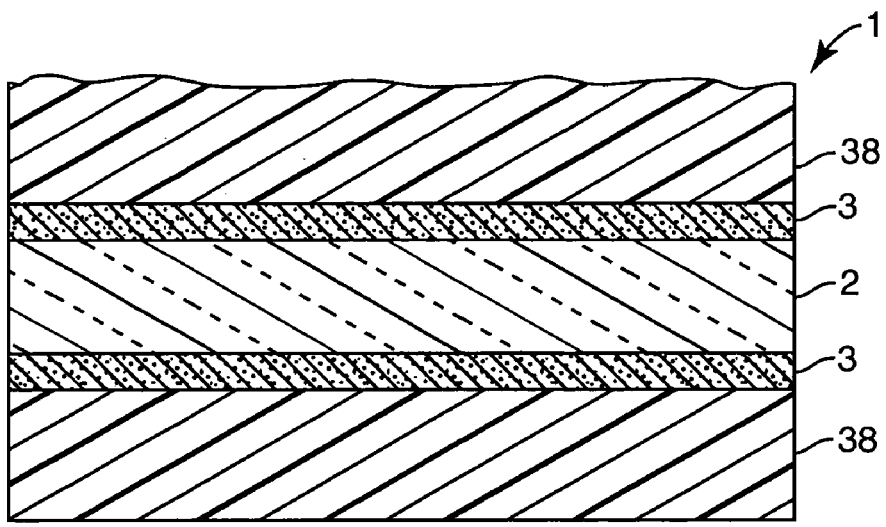
FIG. 1 is a cross-sectional view of a flat panel display (FPD) of the present invention.

A flat panel display (FPD) 1, of the present invention as shown in FIG. 1, employs lightweight, flexible, plastic substrates 38 for constructing FPDs. In between two plastic substrates 38 of the flat panel display are at least two electrodes 3. At least one of the electrodes is transparent for viewing of a display medium 2 positioned between the two electrodes 3. The display medium, as well as some electrode material, are protected from oxidative degradation and reaction with or incorporation of moisture.

Figure 37:
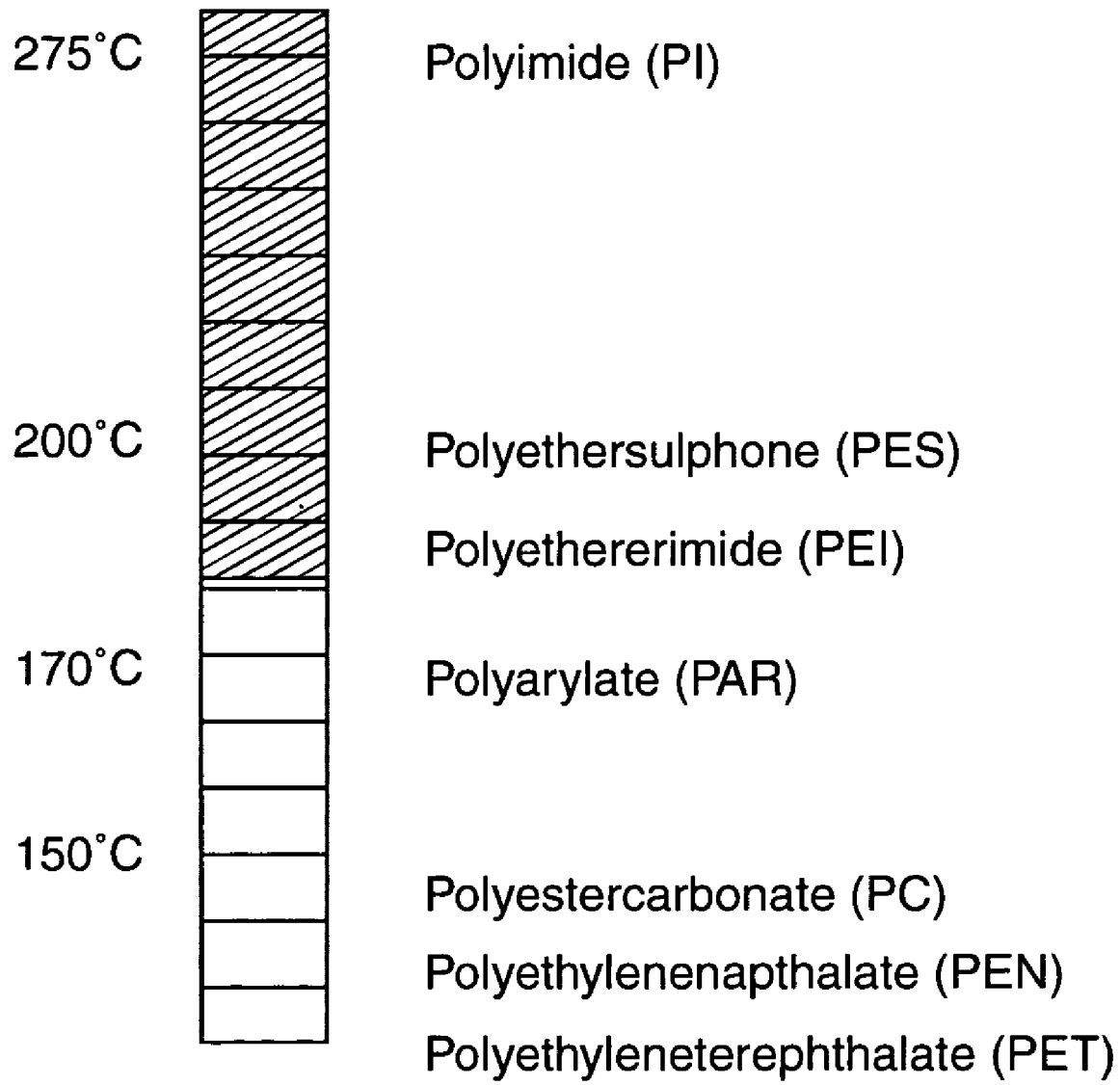
FIG. 37 is a chart showing deposition temperature capabilities of various plastic substrates.

The displays are fabricated using plastic substrates such as various polyolefins, e.g. polypropylene (PP), various polyesters, e.g. PET and other polymers such as polyethylene naphthalate (PEN), polyethersulphone (PES), polyestercarbonate (PC), polyetherimide (PEI), polyarylate (PAR), polyimide (PI), and polymers with trade names ARTON™ (Japanese Synthetic Rubber Co., Tokyo, Japan) and AVATREL™ (B.F. Goodrich, Brecksville, Ohio). FIG. 37 shows deposition temperature capabilities of some of these plastic substrates.

Figure 6:
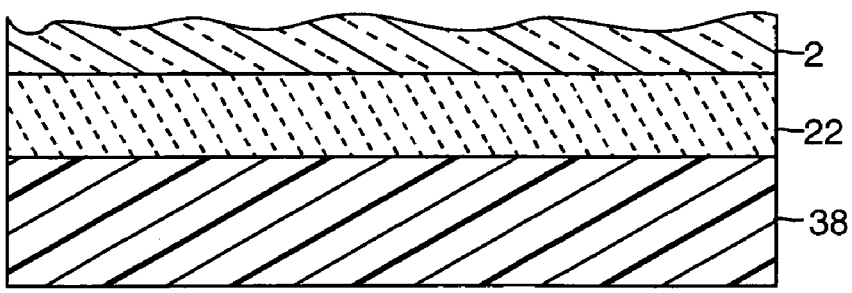
FIG. 6 is a cross-sectional view of an FPD of the present invention.

In the present invention, at least one layer, a conductive barrier layer 3 has both barrier characteristics (to protect the display medium and/or the metal electrode from oxidative degradation and reaction with or incorporation of moisture) and the ability to function as an electrode. The conductive barrier layer is deposited over the substrate to form a composite substrate, as shown in FIG. 6. In particular, layer 3 has both low oxygen and moisture (water vapor) permeability, and a low enough resistivity to function as an electrode for the display.

Figure 2:
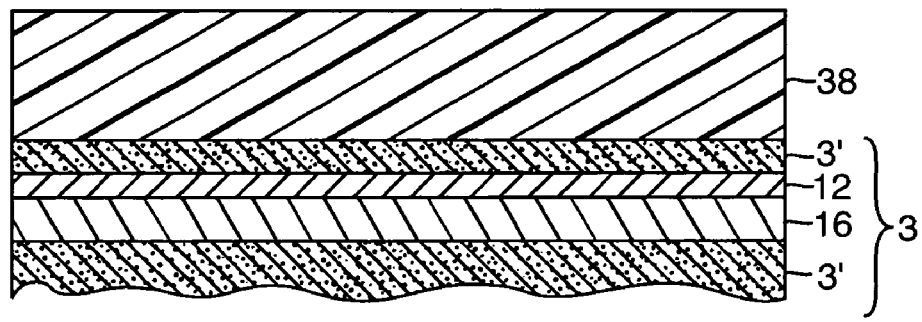
FIG. 2 through FIG. 5 are cross-sectional views of other embodiments of conductive barrier layer 3 of FIG. 1.
Figure 3:
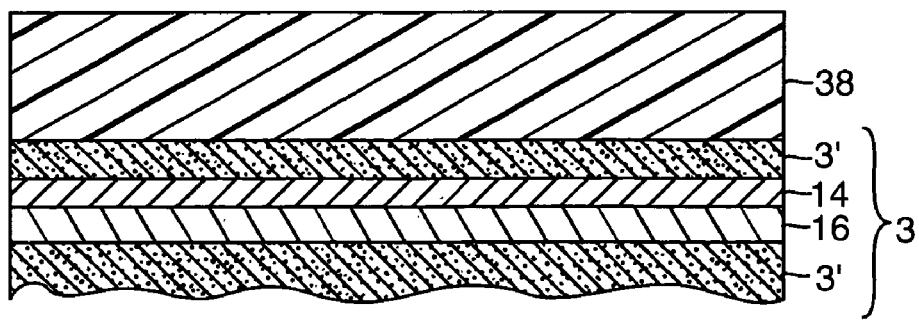
Figure 4:
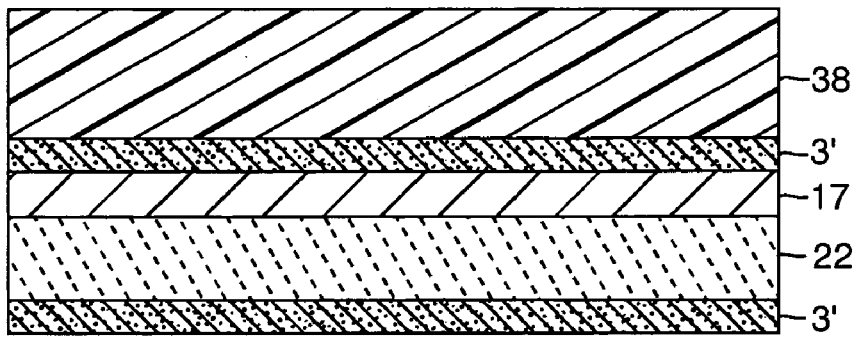
Figure 5:
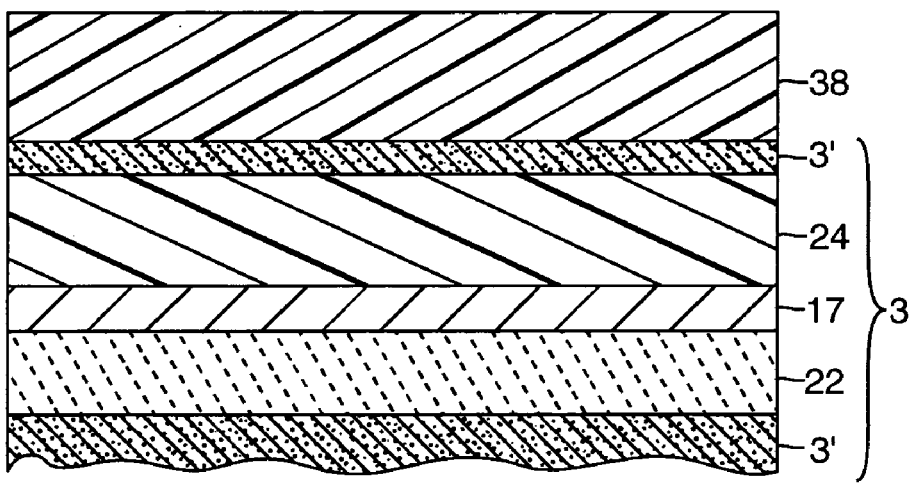

As shown in the general embodiments of FIG. 2 through FIG. 5, conductive barrier layer 3 comprises at least one sublayer 31 deposited over the substrate, for instance a single ITO layer. In an embodiment, at least one pair of sublayers, a dyad, of a polymer layer 24 and a layer of TCO 22, metal 12, metal nitride 14 or metal oxide 16, is deposited over the substrate. FIG. 2 illustrates the sublayer having a dyad of metal 12 and metal oxide 16. FIG. 3 illustrates the sublayer having a dyad of metal nitride 14 and metal oxide 16. FIG. 4 illustrates the sublayer having a dyad of dielectric 17 and TCO 22. FIG. 5 illustrates the TCO layer 22 deposited over the dielectric layer 17 which is deposited over the polymer layer 24. The sublayers 31 deposited on either side of the pairs illustrated in FIG. 2 through FIG. 4 are, for example, a single ITO layer, additional dyads of the same materials, and/or a polymer coating. In an exemplary embodiment, multiple alternating sublayer pairs, comprised of the same materials as the original sublayer pair, are deposited over the substrate or over the previously deposited sublayer.

There are a myriad of possibilities for materials comprising the sublayers of the conductive barrier layer. FIG. 2 through FIG. 5 illustrate generally only some of the more preferred embodiments of sublayer 31 materials for conductive barrier layer 3, while FIG. 7 through FIG. 12 illustrate particularly the more preferred embodiments for the conductive barrier layer.

Figure 9:
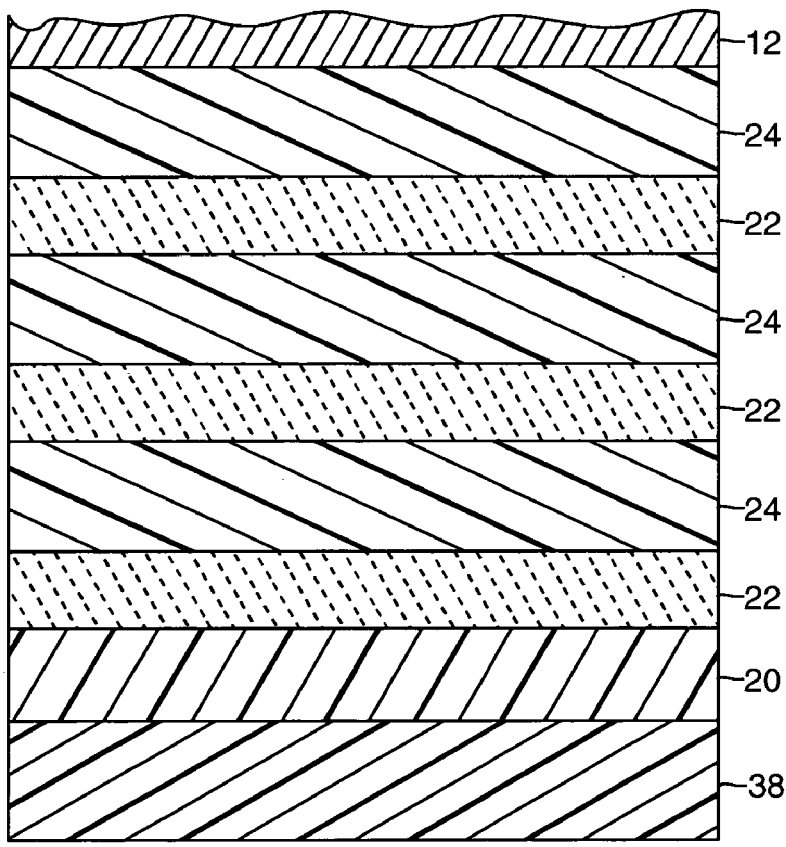
Figure 10:
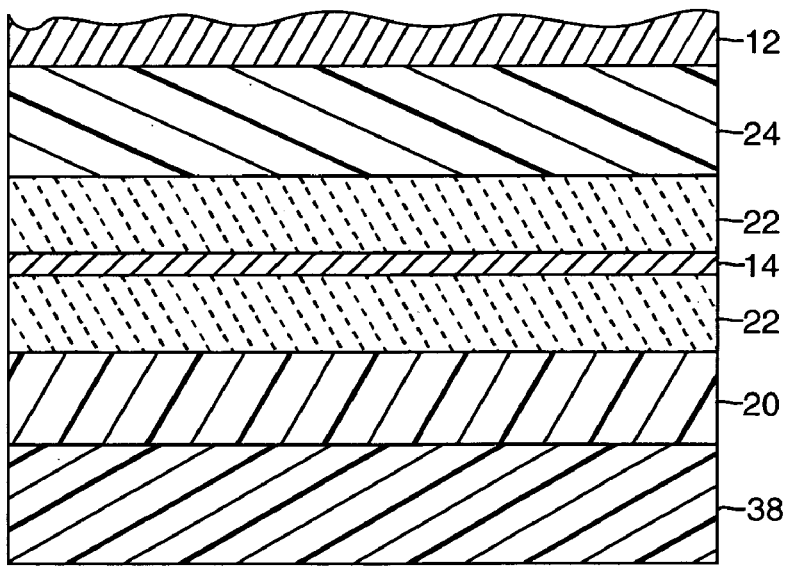

In one embodiment shown in FIG. 9, for example, a base coating 20 is deposited over the substrate 38. The base coating is a polymer smoothing coating applied by a PML process and/or an organic hardcoat. The base coating can be deposited by a non-vacuum liquid coating process (to render a hardcoated PET) or applied by a PML process. When a hardcoat is deposited, the plastic substrate is rendered abrasion resistant. A TCO layer 22 (or metal layer 12) is then deposited over the base coat. In another embodiment, multiple alternating layers of a protective polymer layer 24 and at least one TCO layer 22 (or metal layer 12) are additionally deposited (see FIG. 9). Preferably, the alternating layers additionally deposited are of the same material, e.g. TCO/polymer/TCO, etc. Alternatively, there is no base coat 20 for the embodiment of alternating layers of polymer/TCO/polymer (not shown in FIG. 9). In another embodiment (shown in FIG. 9), a metal conductor or reflector 12 overlays the top polymer layer 24.

Figure 7:
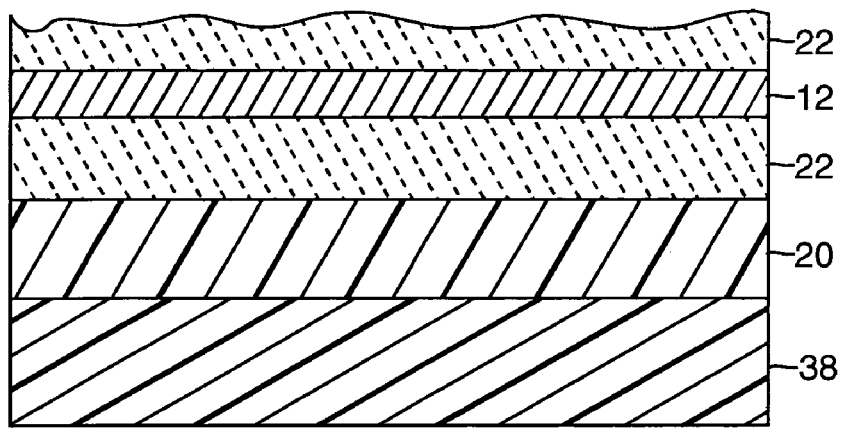
FIG. 7 through FIG. 12 are cross-sectional views of other embodiments of conductive barrier layer 3 of FIG. 1.
Figure 8:
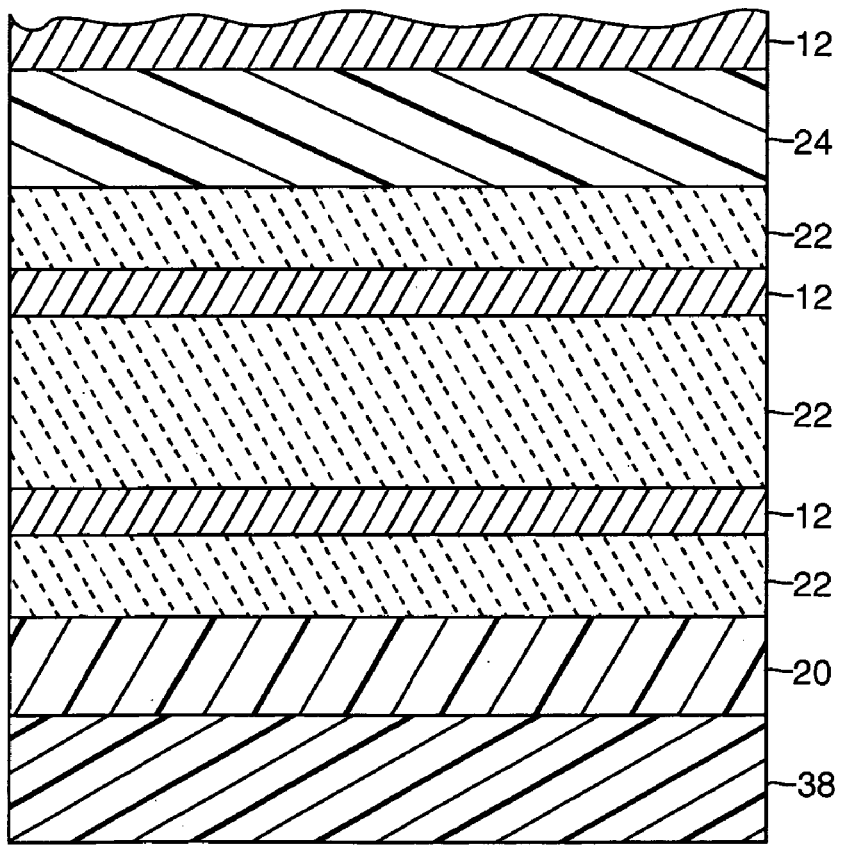

In the embodiment shown in FIG. 7, a substrate 38 is coated with a TCO layer 22, a metal coating 12, and another TCO layer 22. This three layer configuration is called an "optically enhanced metal" and has characteristics similar to a single TCO layer. With the optically enhanced metal, good conductivity, transmission and barrier properties are achieved. In a preferred embodiment, deposited on the three layers is polymer layer 24 (see FIG. 8). The polymer layer 24 may be alternating with the optically enhanced metal (not shown). Alternatively, base coat 20 is deposited over the substrate as shown in FIG. 7. Additionally or alternatively, another dyad (a metal and TCO pair) is deposited over the top TCO layer and/or an additional polymer layer 24 (a polymer overcoat) is deposited over the previously deposited dyad (see FIG. 8). In another alternative, a thick metal layer 12 is deposited over the polymer overcoat layer, as also shown in FIG. 8. Alternatively, the metal nitride layer 14 is substituted for one or more of the metal layers in the above described embodiments, for example, see FIG. 10 and FIG. 11.

In still another embodiment, the substrate is alternatively coated with an inorganic layer (such as the TCO layer or the dielectric metal oxide layer), and polymer layers to provide both barrier and conductive properties.

Figure 12:
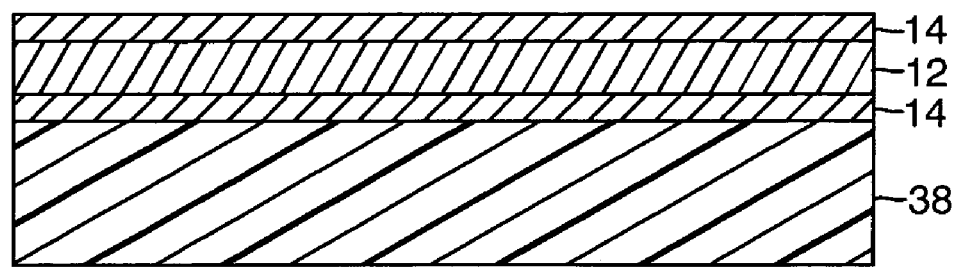

FIG. 12 illustrates metal layer 12 sandwiched between two metal nitride layers 14. Alternatively, additional dyads (metal and metal nitride pair) are deposited over the metal nitride layer. Further embodiments of this dyad pair are similar to the TCO/metal dyad pair embodiments of FIG. 7 and FIG. 8, i.e. the TCO layers of FIG. 7 and FIG. 8 are replaced by one or more metal nitride layers.

In another alternative embodiment, the dielectric layer replaces one or more TCO layers in the above described embodiments (see generally FIG. 4 and FIG. 5). As shown in FIG. 5, multiple alternating layers of dielectric 17 and polymer layers 24 are deposited over the substrate 38. The number of multiple alternating layers (or dyads) vary, and is represented here by 31, sublayers of the conductive barrier layer 3. A TCO layer 22 (or metal layer 12) is then deposited over the top of multiple alternating layers. These multiple alternating layers together with the TCO have adequate barrier and conductivity characteristics as described in more detail below.

Each TCO layer 22 of the above embodiments is a single TCO layer. Alternatively, the TCO layers in the Figures described above represent the thickness of two TCO layers from adjacent layers of "optically enhanced metal" of FIG. 8 or the metal nitride alternative of FIG. 11.

Preferably, the metal layers that are in the alternating dyad pairs or in between the TCO, metal nitride, or dielectric layers, are thin. In addition, metal layers that are adjacent the display matrix, i.e. overlaying the dyad layers, have a greater thickness than the sandwiched metal layers.

Sublayer 31 materials that provide transparent barrier properties are thin transparent metal oxides 16, and/or thin transparent metallic films 12, and/or thin metal nitrides 14, for example silicon nitride, and aluminum nitride. The polymer layer 24 enhances barrier properties by reducing the number of holes and defects in the films upon which or under which, they are deposited. The metal oxide layer 16 comprises the dielectric layer 17 and/or the transparent conductive oxide layer 22. Thicknesses for the barrier layers are in the nanometer and angstrom range. Thicknesses for the PML deposited layers are in the micron range. For example, improved barrier coating occurs when a PML deposited organic polymer layer (a base coat), and/or a metal oxide layer is placed over the plastic substrate. See Table 2, shown below in the section entitled "Results of Conducted Experiments"

Sublayer 31 materials that provide conductive properties include the thin TCO layer 22, a thin transparent metallic film layer 12 (such as aluminum, silver, copper, gold, platinum, palladium, and alloys thereof), and the metal nitride layer 14 (such as transition metal nitrides, for example, nitrides of Group III and Group IV elements of the Periodic Table, e.g. gallium nitride, silicon nitride and titanium nitride). Thicknesses for the conductive layers are in the nanometer and angstrom range. Preferably the TCO is formed from multiple thin layers of TCO deposited with electrical contact to each other and separated by polymer layers, so that a low resistivity is achieved and the TCO functions as both the electrode and a barrier.

In the preferred embodiment, the PML processed base coat 20 is deposited over the substrate as shown in FIG. 9. The base coat produces substrate smoothing, and more importantly, in combination with other layers, the base coat has surprisingly effective vapor barrier enhancement properties because of the smoothing and protection characteristics. The sublayers are preferably deposited in combination with the process illustrated in FIG. 13, as described below.

Using the smoothing base coat layer over the plastic substrate imparts good optical and barrier quality throughout the substrate layers and provides a pristine surface for nucleation of the deposited TCO electrode layer. The basecoat smoothes over any surface roughness of the plastic substrate, thereby adding to the FPD lifetime and optical quality.

In an exemplary embodiment, one or more metal oxide layers are replaced with a TCO layer. When TCO coatings, including ITO, cadmium oxides ($CdSn_2O_4$, $CdGa_2O_4$, $CdIn_2O_4$, $CdSb_2O_6$, $CdGeO_4$), tin oxides, indium oxides ($In_2O_3$: Ga, $GaInO_3$ (Sn, Ge), $(GaIn)_2O_3$), zinc oxides (ZnO (Al), ZnO(Ga), $ZnSnO_3$, $Zn_2SnO_4$, $Zn_2In_2O_5$, $Zn_3In_2O_6$), and/or magnesium oxides ($MgIn_2O_4$, $MgIn_2O_4$—$Zn_2In_2O_5$)

are deposited on the plastic substrate at a low temperature, they have an amorphous microstructure. Characteristics of the above TCO materials are shown below in Table A:

The sheet then passes coating station 46 where a coating of TCO is preferably applied by magnetron sputtering. The sheet then passes another flash evaporator 47 where another

TABLE A

EMERGING TRANSPARENT CONDUCTING OXIDES FOR ELECTRO-OPTICAL APPLICATIONS
CHARACTERISTICS OF EMERGING TCO MATERIALS

| Material | Trans. (%) | Resistivity ($\times 10^{-4}$ $\Omega$cm) | Carrier Conc. ($\times 10^{20}$ cm$^{-3}$) | Mobility (cm$^2$/V$^{-1}$s$^1$) | Film Thickness (nm) | References |
|---|---|---|---|---|---|---|
| CdSn$_2$O$_4$ | 88 | 1.2 | 9.0 | 59.6 | 530 | Wu, X. et al., JVST A 15(3), 1997 |
| CdGa$_2$O$_4$ | | 83 | 10 | | | Omata, T. et al., Appl. Phys. Lett. 62(5), 1993 |
| CdIn$_2$O$_4$ | 90 | 2.3 | 6.1 | 44.2 | 290 | Wu, X. et al., JVST A 15(3), 1997 |
| CdSb$_2$O$_6$ (Y) | 90 | 240 | 1.3 | 1.9 | 170 | Yanagawa, K. et al., Appl. Phys. Lett. 65(4), 1994 |
| Cd$_2$GeO$_4$ | 98 (Internal) | 1000 | 0.1 | 5 | | Hosono, H. et al., Appl. Phy. Lett. 67(18), 1995 |
| ITO | 91 | 1–2 | 10 | 37 | 140 | Heiz, B., OIC Topical Meeting, 1998 |
| ZnO(Al) | 90 | 1.4 | 9.9 | 45 | 150 | Imaeda, K. et al., 43$^{rd}$ AVS Symp., 1996 |
| ZnO(Ga) | 90 | 2.7 | 13 | 18 | 230 | Imaeda, K. et al., 43$^{rd}$ AVS Symp., 1996 |
| ZnSnO$_3$ | 80 | 45 | 1 | 20 | 310 | Minami, T. et al., JVST A 13(3), 1995 |
| Zn$_2$SnO$_4$ | 92 | 570 | 0.058 | 19.0 | 620 | Wu, X. et al., JVST A 15(3), 1997 |
| Zn$_2$In$_2$O$_5$ | 95 | 2.9 | 6.0 | 30 | 400 | Minami, T. et al., Thin Solid Films 290–291, 1996 |
| Zn$_3$In$_2$O$_6$ | 80 | 3.8 | 3.4 | 46 | 1400 | Phillips, J. et al., Appl. Phys. Lett. 67(15), 1995 |
| MgIn$_2$O$_4$ | 85 | 20 | 1.8 | 15 | | Minami, T. et al., Thin Solid Films 270, 1995 |
| MgIn$_2$O$_4$—Zn$_2$In$_2$O$_5$ | 82 | 10 | 3 | 2 | 400 | Minami, T. et al., ICMC TF, 1995 |
| In$_2$O$_3$:Ga | 85 | 5.8 | 5 | 20 | 400 | Minami, T. et al., JVST A 15(3), 1997 |
| GaInO$_3$ (Sn,Ge) | 90 | 29 | 4 | 10 | 1000 | Phillips, J. et al., Appl. Phys. Lett. 65(1), 1994 |
| (GaIn)$_2$O$_3$ | 90 | 10 | 3 | 20 | 100 | Minami, T. et al., JVST A 15(3), 1997 |

The amorphous structure and oxygen deficiency of the TCO theoretically allows the TCO coating to exhibit conductive properties and barrier properties similar to transparent dielectric barrier layers, such as nonstoichiometric types of silica or alumina. Also, because of the oxygen deficiency, the barrier layers gather the oxygen and keep the oxygen from passing through. Multiple thin layers of TCO function as both a transparent electrode and a transparent barrier layer. The benefit of using TCO alternating with metallic film layers, besides the beneficial barrier properties, is that all the layers of the structure are conductive, thus improving conductivity.

Figure 13:
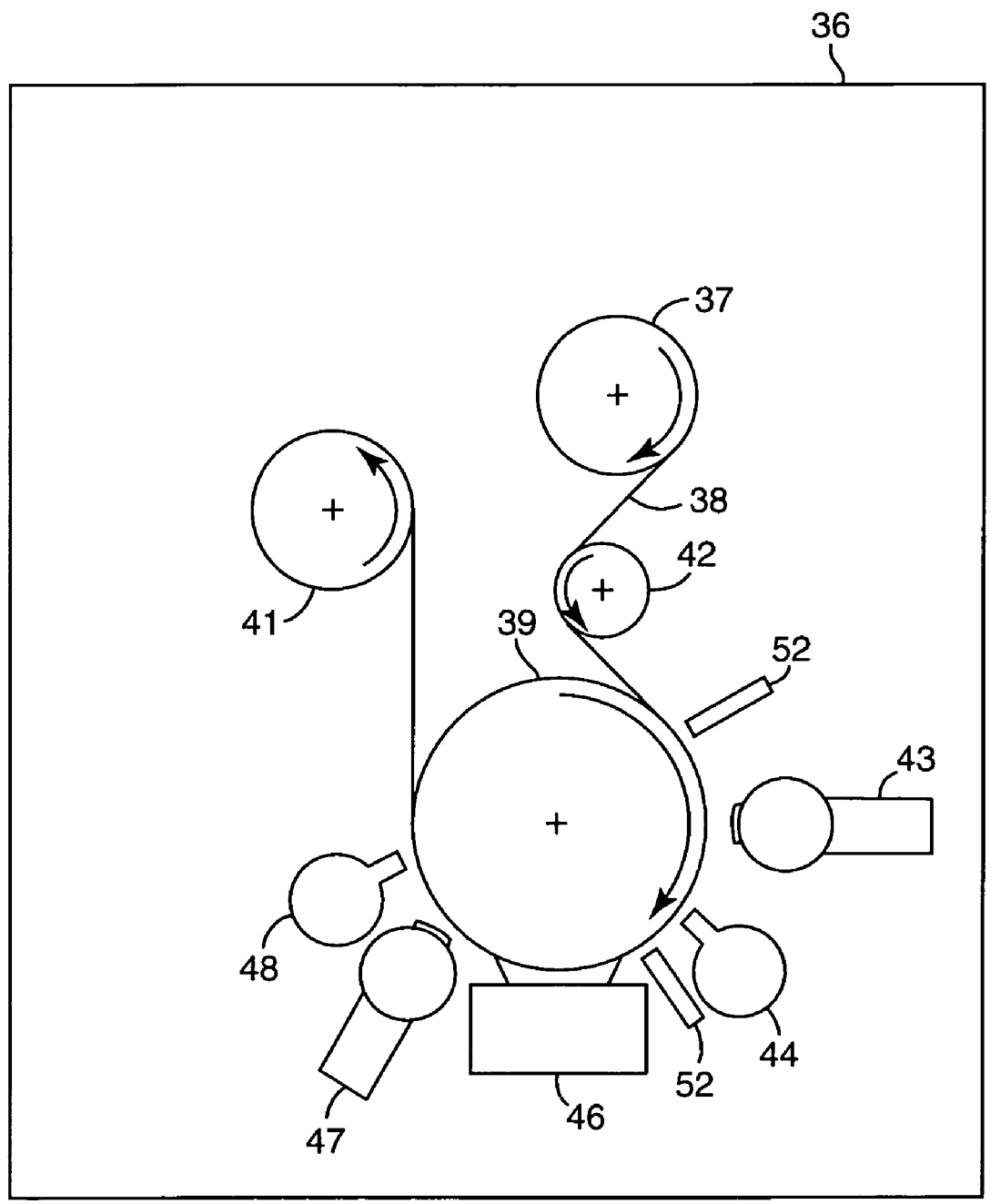
FIG. 13 is a schematic illustration of a coating apparatus for forming the conductive barrier layer of FIG. 1.

In the preferred embodiment, a suitable apparatus for coating the substrate with conductive and barrier layers is illustrated schematically in FIG. 13. All of the coating equipment is positioned in a vacuum chamber 36. A roll of polypropylene, polyester or other suitable plastic sheet is mounted on a pay-out reel 37. Plastic sheet 38 forming the substrate is wrapped around a first rotatable drum 39, and fed to a take-up reel 41. A roller 42 is employed, as appropriate, for guiding the sheet material from the payout reel to the drum and/or to the take-up reel.

A flash evaporator 43 is mounted in proximity to the drum at a first coating station. The flash evaporator deposits a layer or film of monomer, typically an acrylate, on the substrate sheet as it travels around the drum. After being coated with a monomer, the substrate sheet passes a radiation station where the monomer is irradiated by a source 44 such as an electron gun or source of ultraviolet (UV) radiation. The UV radiation or electron bombardment of the film induces polymerization of the monomer.

layer of monomer is deposited over the TCO layer. The sheet then passes radiation station 48 and the monomer is polymerized. Depending on whether a layer of monomer is above or below the TCO layer, either evaporator 43 or 47 is used. Clearly, if the TCO layer is to be sandwiched between layers of polymer, both evaporators and their respective radiation sources are used. In addition to magnetron sputtering, the TCO layer may be processed by one of thermal evaporation, chemical vapor deposition, plasma enhanced chemical vapor deposition, and electron beam evaporation. Chemical vapor deposition is a high temperature process, and is therefore the least desirable for use with plastic substrates.

In an alternative embodiment, a liquid smoothing applicator 52 is mounted in proximity to the drum at a first coating station. The liquid smoothing applicator deposits a layer of monomer, e.g. acrylate, over the substrate. This layer of monomer is cured by irradiation from an ultraviolet or electron beam source 44 adjacent the drum (the positions of source 44 and applicator 52 are interchanged). Additionally, the sheet then passes coating station 46 where a coating of thin metal film, metal oxide, and/or metal nitride is applied by one of vacuum sputtering, vacuum metallizing, plasma assisted chemical vapor deposition, or electron beam evaporation. For example, silicon oxides is deposited by a plasma enhanced chemical vapor deposition process using a metal organic precursor and an oxidizing or inert carrier gas coating station 46 alternatively containing deposition sources.

The various layers described can be deposited in several processes in addition to vacuum coating techniques. For instance, the layers can be deposited through roll coating. Additionally, the layers can be deposited by an in line coating machine, whereby a conveyor belt runs the substrate to be coated past multiple coating stations. In a further alternative, the layers can be deposited by an intermittent motion machine. In yet another alternative, the layers are coated using a multitude of machines. For instance, the plastic substrate can first be coated through atmospheric roll coating with a cured polymer and subsequently coated by vacuum deposition, or liquid coated, such as Gravure coating.

For multiple layers of organic polymer coatings deposited in the PML process, take up reel 41, with the sheet wound thereon, functions as the pay out reel 37, and the process is repeated as desired by coating in both directions. For this alternative, additional curing stations are mounted on the opposite side of evaporators 43 or 47. The roll of sheet is removed from the vacuum system for use.

Figure 14A:
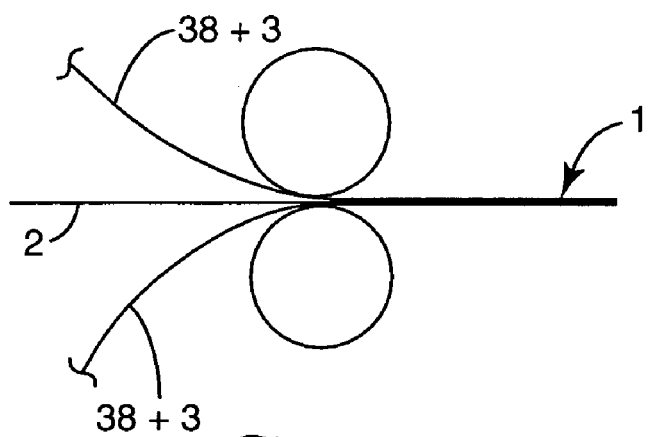
FIG. 14a is a schematic illustration of a laminating process for the FPD of FIG. 1.
Figure 14B:
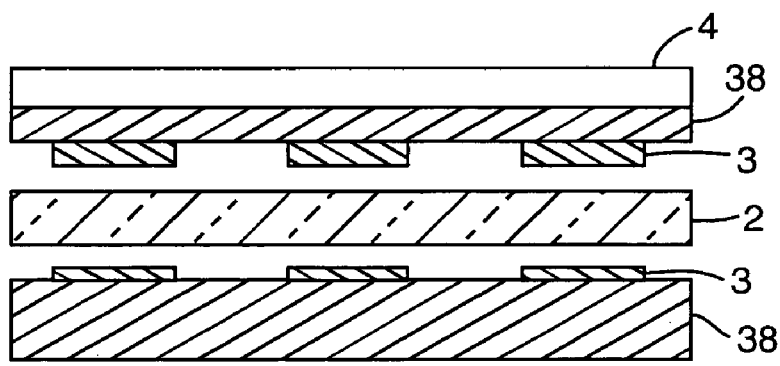
FIG. 14b is a cross-sectional view of the FPD before undergoing a bonding process.
Figure 14C:
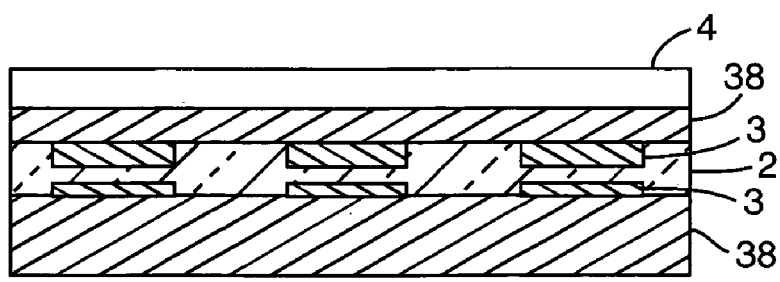
FIG. 14c is a cross-sectional view of the FPD after undergoing a bonding process.

FIG. 14a illustrates a laminating process for the FPD where plastic substrates, hardcoating, and a display medium are bonded together with an adhesive, pressure and temperature or through UV radiation. FIG. 14b and FIG. 14c are cross-sectional schematic views of the FPD before and after undergoing the bonding process, respectively. The laminating process is one of the alternate methods for bonding the layers to construct the FPD. Because the layers of the present invention are thin, cracking, crazing, and delamination are avoided using processing methods of this type. FIG. 14b and FIG. 14c illustrate schematically the flat panel display with an exterior protective overcoat 4 and the display medium 2.

Transparent dielectric layers with good barrier properties and a high refractive index, such as metal oxides like titanium oxide or aluminum oxide, or metal nitrides such as silicon nitride or aluminum nitride, used in combination with thin, transparent metallic film layers provide a transparent conductive barrier coating. The metal oxide or metal nitride layers are deposited at specific thicknesses to optimize the optical performance (e.g. transmittance) of a particular display. Preferably, the thin metallic film layer is sandwiched in between layers of metal oxide or metal nitride. Multiple alternating layers of metal oxides or metal nitrides, with their barrier properties, and the highly conductive metallic film layers provide increased barrier performance and conductivity for a particular display medium.

The optical and electrical performance of transparent conductive oxide coatings are also improved by mildly heating the coated substrate during deposition or by post-annealing the coated substrate. As shown in the Experimental Results below, even though the PET substrate was heated to a moderate temperature of only 65° C., the resistivity of the ITO was still low enough to effectively operate as an electrode, because of the multiple thin layers of ITO.

Figure 11:
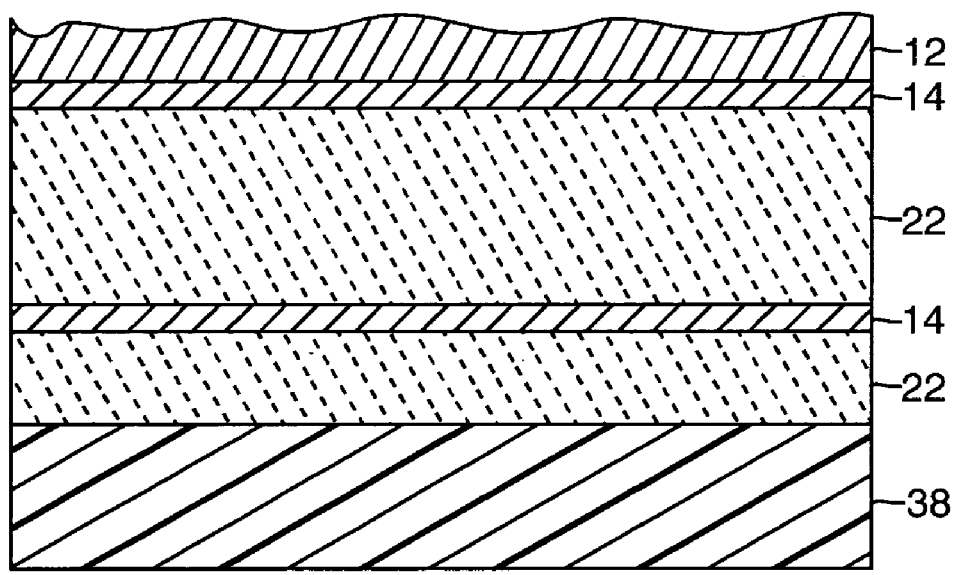

In an alternative embodiment, the thin conductive metal nitride layer is substituted for one or more thin metallic film layers, for example, for the metal layers in the "optically enhanced metal" (see FIG. 11). Metal oxide or TCO layers are utilized with the metal nitride layer for enhancing both the optical and electrical performance characteristics. Metal nitrides have good gas barrier properties. However, to achieve very low moisture (water vapor) and oxygen permeability, there is a minimum thickness of barrier material, e.g. the metal nitride layer. Because of the higher optical transparency silicon nitride thin films, for example, are attractive candidates for flexible FPD as barrier layers for atmospheric gases.

In another alternative embodiment, at least one of the metallic film layers in, for example, the "optically enhanced metal" is replaced with a polymer layer formed via the PML processes.

Results of Conducted Experiments

The plastic substrate for a flat panel display has a very low oxygen and water vapor permeability, a surface roughness much less than the barrier film thickness, a high Tg (the glass transition temperature) to allow a higher temperature and/or higher energy ITO deposition process, and a high transparency with low birefringence.

Defects in the coated layers limit the barrier properties. For instance, rough substrates, particulates, and roller contact, damage the coated layers. Rough substrates with thin film barriers are smoothed and prevented from damage by roller contact, with an organic basecoat and polymer top coat.

Multiple layers of TCO deposited on the substrate achieve lower surface resistivity than a single thick layer of TCO because the single layer cracks or crazes. Further, the multiple TCO layers act as electrodes connected in parallel. Using a non-stoichiometric dielectric of a group including silicon oxides, aluminum oxides, and silicon nitrides, allows for the fabrication of efficient thin film barriers for flexible plastic films.

Measured data for films made of sputtered ITO exhibited exceptional barrier properties. The optical, electrical and barrier properties were measured for ITO sputter-deposited directly onto a PET substrate, and also measured with a PML acrylic basecoat over the substrate before deposition of the ITO, in a roll-to-roll (web) coating process. See FIG. 15 through FIG. 18, and the descriptions of these Figures below. The typical performance of a single ITO layer deposited on a basecoated PET substrate is 85% T (Transmittance) and 80 ohms/square. The ITO layer has a physical thickness of about 140 nm, for a one-half wave optical thickness, while the PET substrate has a thickness of about 0.007 inches. For the single layer ITO film, oxygen permeability ranged from 0.005 to 0.05 oxygen cc/m$^2$ day, while the water vapor permeability ranged from 0.005 to 0.05 g/m$^2$ day.

Figure 15:
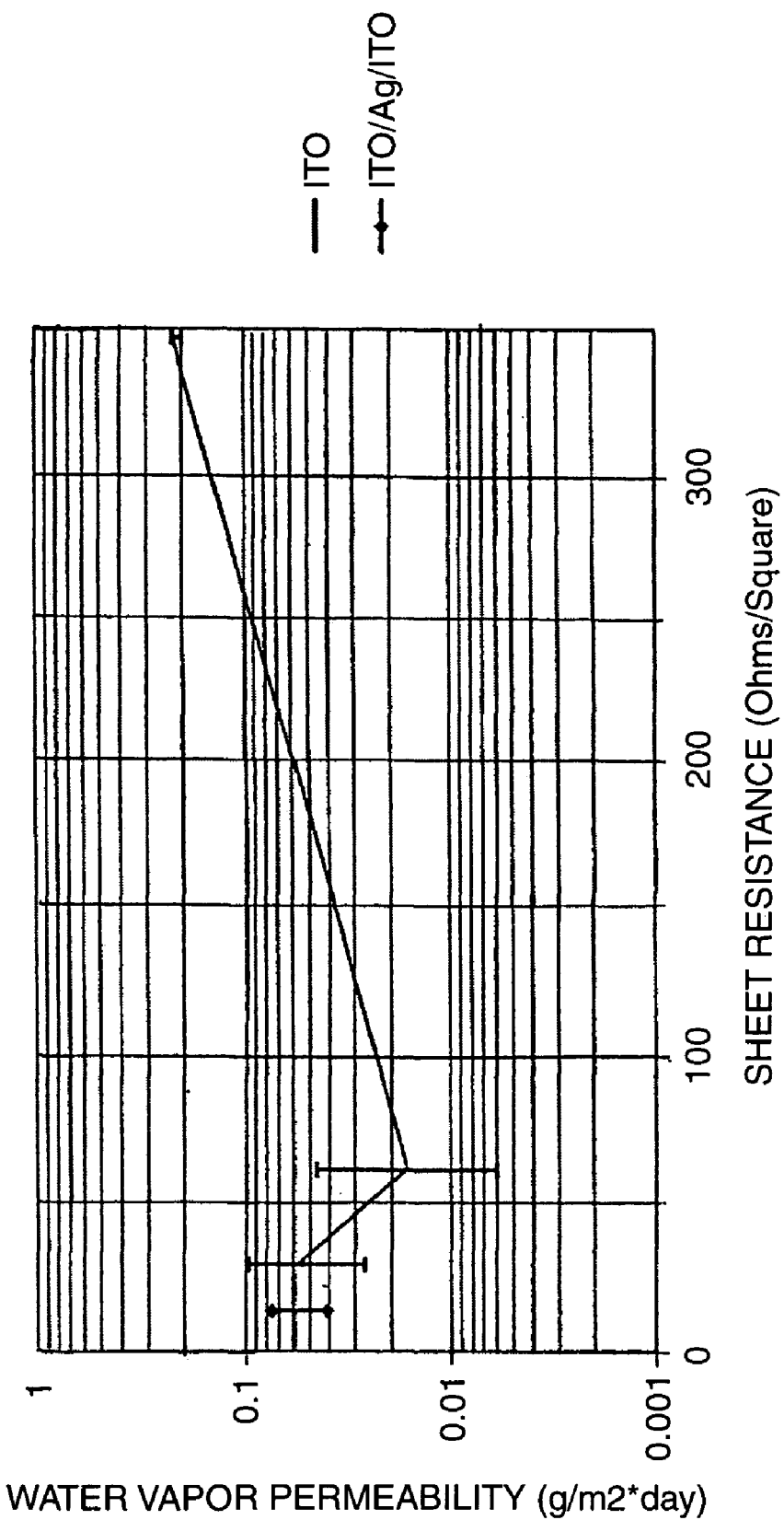
FIG. 15 is a chart showing water vapor permeability of ITO and ITO/Ag/ITO films deposited on a PET substrate versus ITO film sheet resistance.

FIG. 15 discloses a chart showing water vapor permeability of (1) ITO film deposited over the PET substrate, and (2) a PET substrate coated with an optically enhanced metal layer formed from an ITO film layer, a silver layer, and another ITO film layer, versus sheet resistance. No smoothing base coat was applied to the substrate in either case. The ITO layer was DC sputter deposited onto the PET substrate from a ceramic target in a web coater. The solid vertical lines shown connect the midpoints of the range of permeability results at each measured resistance for the film sheet. FIG. 15 shows that for the ITO film layer, the water vapor permeability dips to a minimal value of approximately 0.006 g/m$^2$ day at a resistance of about 60 ohms/square. The water vapor permeability reaches a maximum of approximately 0.21 g/m$^2$ day at a resistance of about 350 ohms/square. For the silver layer in between the ITO film layers, the approximate water vapor permeability range was 0.04 to 0.075 g/m$^2$ day for the sheet resistance at about 12 ohms/square.

Figure 16:
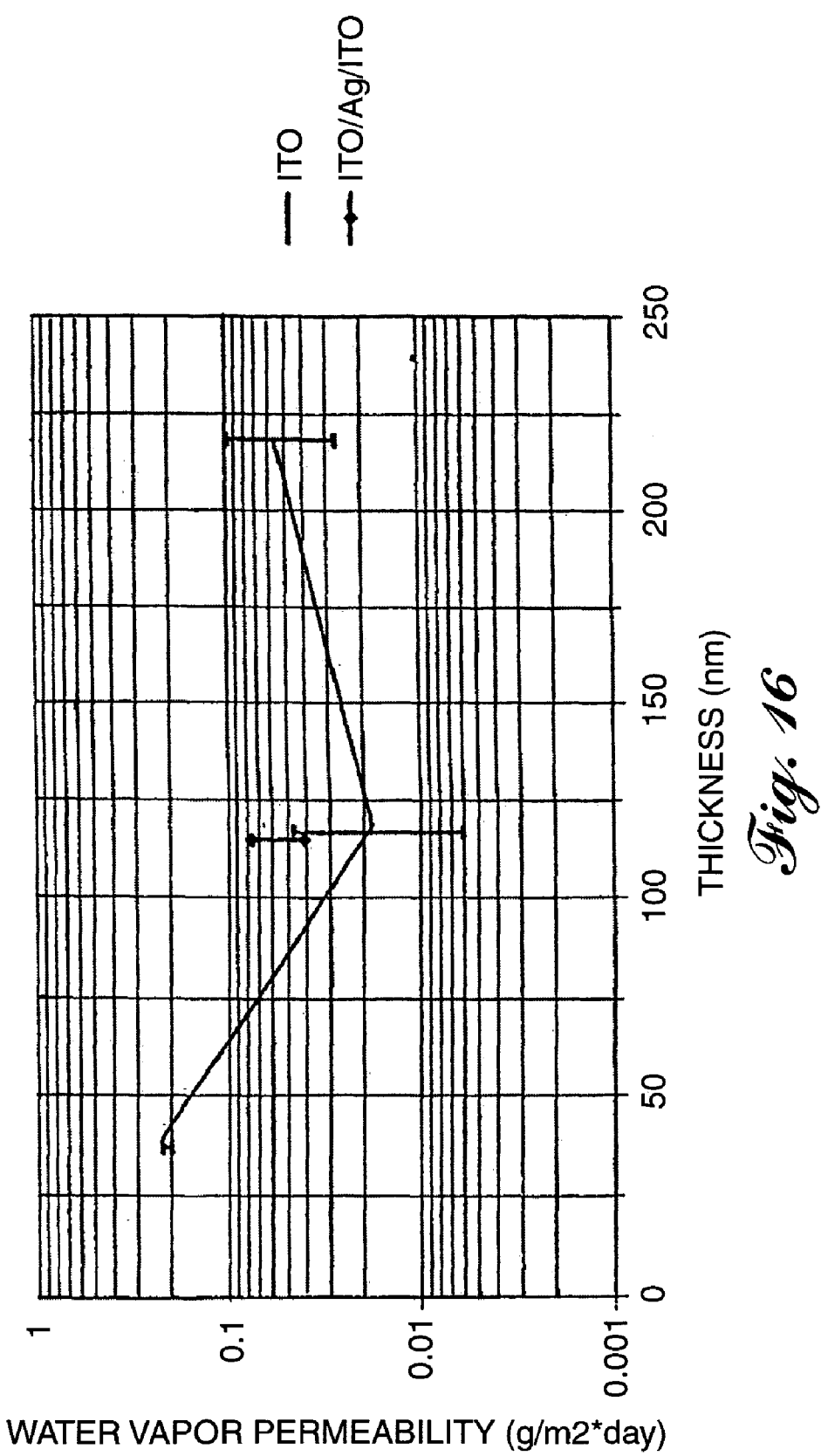
FIG. 16 is a chart showing water vapor permeability of ITO and ITO/Ag/ITO films deposited on a PET substrate versus ITO film thickness.

FIG. 16 discloses a chart showing water vapor permeability of an (1) ITO film deposited over the PET substrate, and (2) a PET substrate coated with an optically enhanced metal layer formed from an ITO film layer, a silver layer, and another ITO film layer, versus film thickness. The parameters for the ITO layer alone are analyzed in the same manner as above. FIG. 16 shows that for the ITO film layer, the water vapor permeability dips to a minimal value of approximately 0.006 g/m² day at a thickness of about 120 nm. The water vapor permeability reaches a maximum of approximately 0.21 g/m² day at a thickness of about 40 nm. For the substrate with the silver layer in between the ITO film layers, the approximate water vapor permeability range was 0.04 to 0.075 g/m² day for a film thickness of approximately 120 nm.

Figure 17:
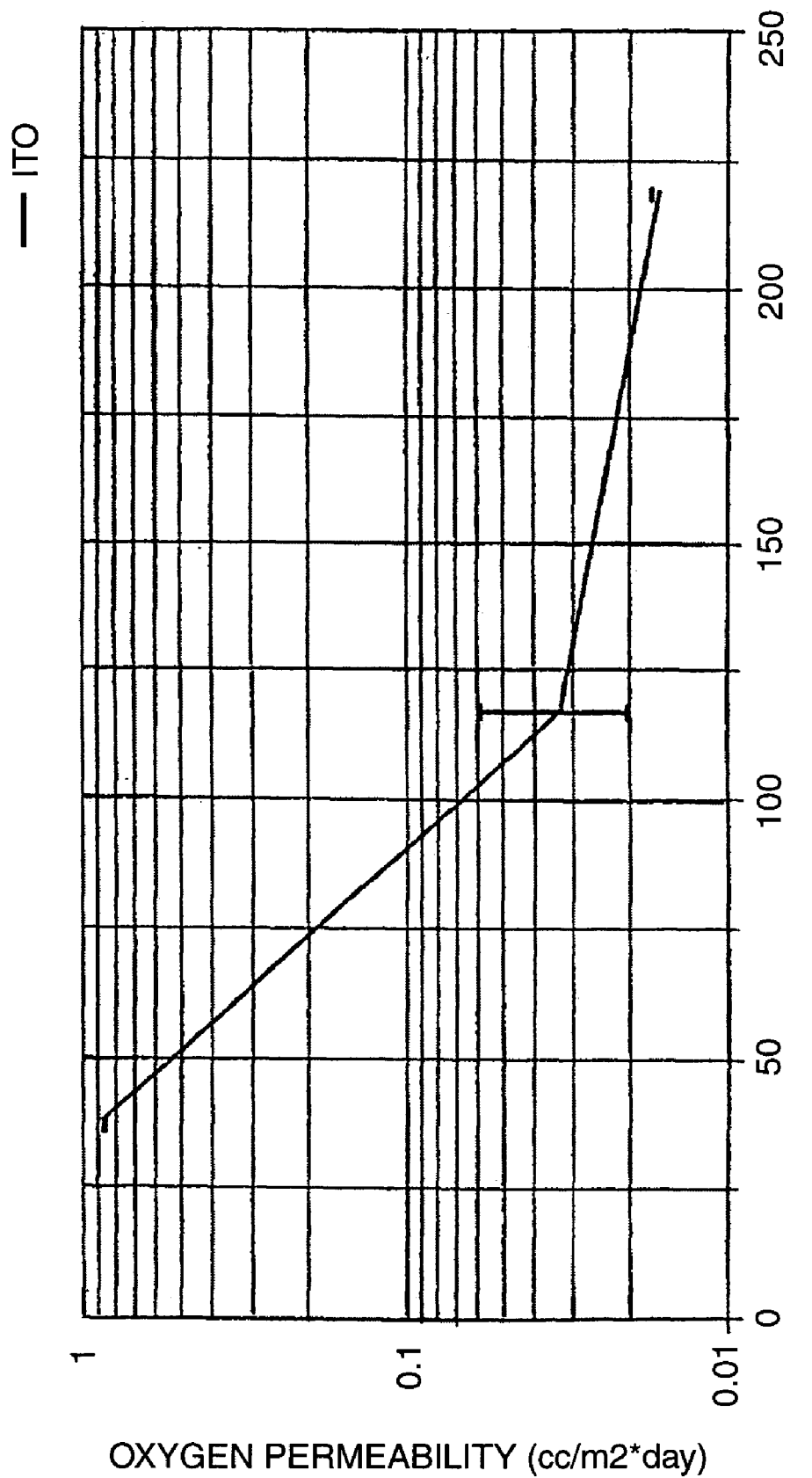
FIG. 17 is a chart showing oxygen permeability of ITO film deposited on a PET substrate versus ITO film thickness.
Figure 18:
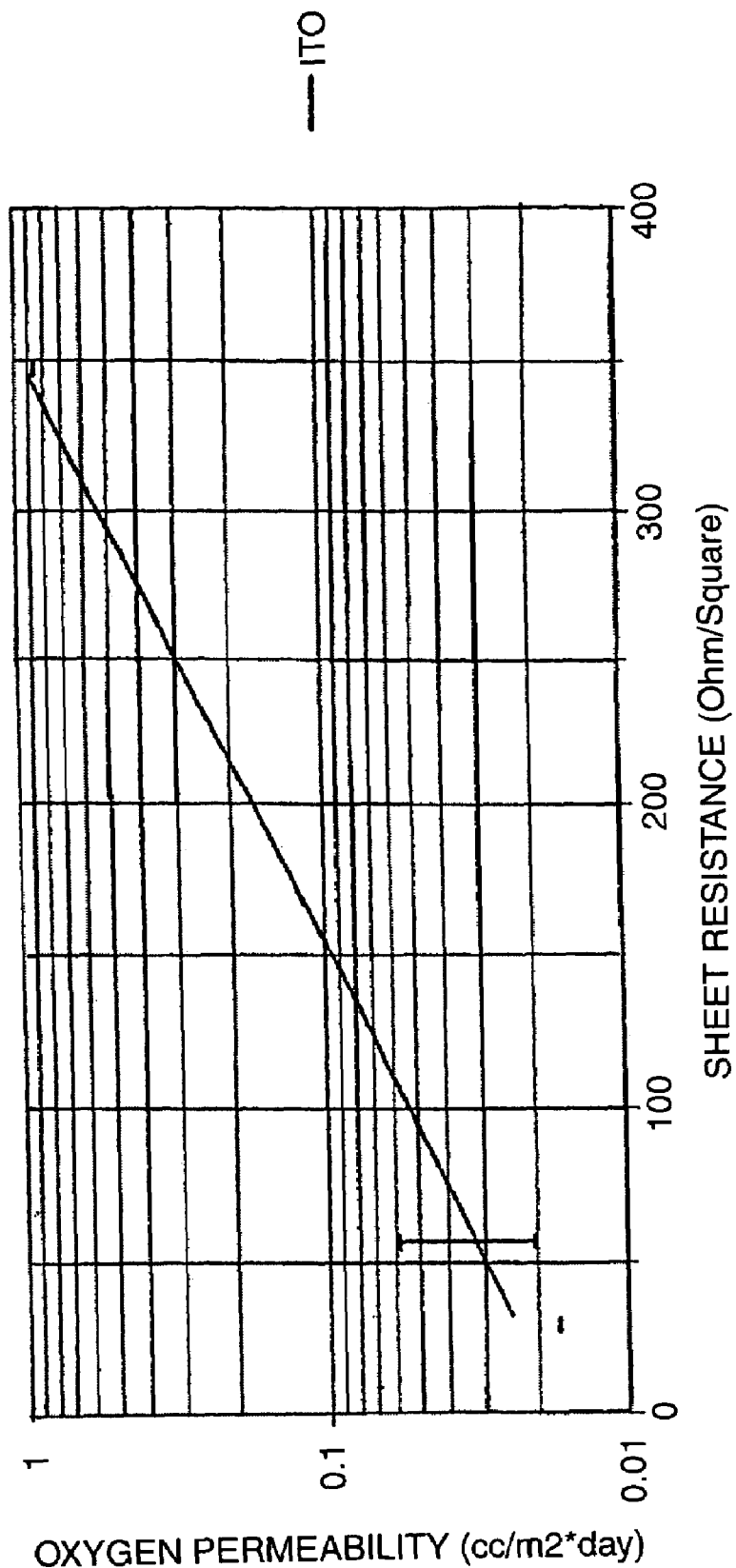
FIG. 18 is a chart showing oxygen permeability of ITO film deposited on a PET substrate versus ITO film sheet resistance.

FIG. 17 and FIG. 18 disclose charts showing oxygen permeability of ITO film deposited on a PET substrate versus ITO film thickness and versus sheet resistivity, respectively. FIG. 17 shows that the oxygen permeability dips to a minimal value of approximately 0.017 g/m² day at an ITO thickness of about 220 nm. The oxygen permeability reaches a maximum of approximately 0.9 cc/m² day at an ITO thickness of about 40 nm.

Alternating barrier layers of PML deposited organic polymers and dielectrics have permeation rates below the limits of the instruments, which is 0.005 g/m² day for a PERMATRAN-W™ 3/31 instrument, which measures water vapor transmission rates, and 0.005 cc/m2 day for an OX-TRAN™ 2/20 instrument, which measures oxygen transmission rates.

The transparent dielectric barrier layer or a single layer of TCO deposited on the substrate meets the barrier requirements for some plastic FPD. Barrier requirements vary by the type of display technology, e.g., liquid crystal display (LCD), organic light emitting display (OLED) and thin film electro luminescent display (TFELD). The acceptable value of vapor permeation with plastic substrates for FPD depends on the sensitivity of the specific display technology utilized. For example, the LCD is much less sensitive to vapor permeation than the OLED or TFELD. For the LCD, maximum oxygen permeability is in the range of about 0.01 to 0.1 cc/m² day, while the maximum water vapor permeability is in the range of about 0.01 to 0.1 g/m² day. For both OLED and TFELD, permeabilities of ≦0.001 cc/m² day for oxygen, and ≦0.001 g/m² day for moisture (water vapor) are required.

A polymer OLED and a small molecule OLED describe the two basic technologies for the layer that emits light in the OLED. For polymer OLEDs, the light emitting material is deposited by flow coating, spin coating, gravure coating, meniscus coating, curtain coating or any common liquid coating or printing techniques. Small molecule OLEDs are typically vacuum deposited, but may also be processed with atmospheric coating if the OLED is a polymer. When an ITO layer is deposited by nonvacuum processes such as by screen printing, the process of the present invention is entirely nonvacuum. Alternatively, the process of the present invention takes place by both vacuum and nonvacuum methods. Preferably, the process takes place in a vacuum to avoid contamination by particulates. Superior barrier films and other films are provided by the cleaner vacuum process.

As shown in FIG. 15 and FIG. 16, as long as the ITO sheet resistance is below about 250 Ohms/square, and the ITO film thickness is between about 75 and 225 nm, the water vapor permeability is within desirable limits for an LCD. As shown in FIG. 17 and FIG. 18, the oxygen permeability is within desirable limits for an LCD as long as the ITO film thickness is above about 85 nm and the sheet resistance is below about 150 Ohm/square. Because of the lower permeabilities required for the emissive displays (e.g. OLED and TFELD), multilayer dielectric or TCO barriers in combination with PML processed polymer coatings (i.e. composite barrier layers of PML deposited organic polymer layers, dielectric layers and/or TCO layers) are required.

Table B illustrates water vapor and oxygen permeability versus ITO thickness for semi-reactively sputtered ITO:

TABLE B

TRANSPARENT BARRIER COATINGS BASED ON
ITO FOR FLEXIBLE PLASTIC DISPLAYS
Experiment results for ITO Barriers on PET
Semi-Reactively Sputtered

| Total ITO Thickness (nm) | Surface Resistivity (ohms/square) | Rho (×10⁻⁴ n-cm) | % T vis (Luminous) | $H_2O$ Permeance (cc/m²-day) | $O_2$ Permeance (g/m²-day) |
|---|---|---|---|---|---|
| 123.3 | 38.3 | 4.685 | 84 | 0.038 | 0.827 |
| 172.4 | 29.9 | 5.145 | 82 | 0.073 | 1.19 |
| 299.2 | 17.2 | 5.15 | ~81 | 0.049 | 0.081 |
| 49.9 | 188.4 | 9.4 | ~81 | 0.036 | 0.156 |
| 218.5 | 31.8 | 6.94 | ~80 | 0.0621 | 0.038 |
| 117.05 | 57.48 | 6.64 | ~82 | 0.12 | 0.0246 |
| 74.3 | 348.5 | 25.6 | ~86 | 0.2375 | 0.8625 |

Figure 19:
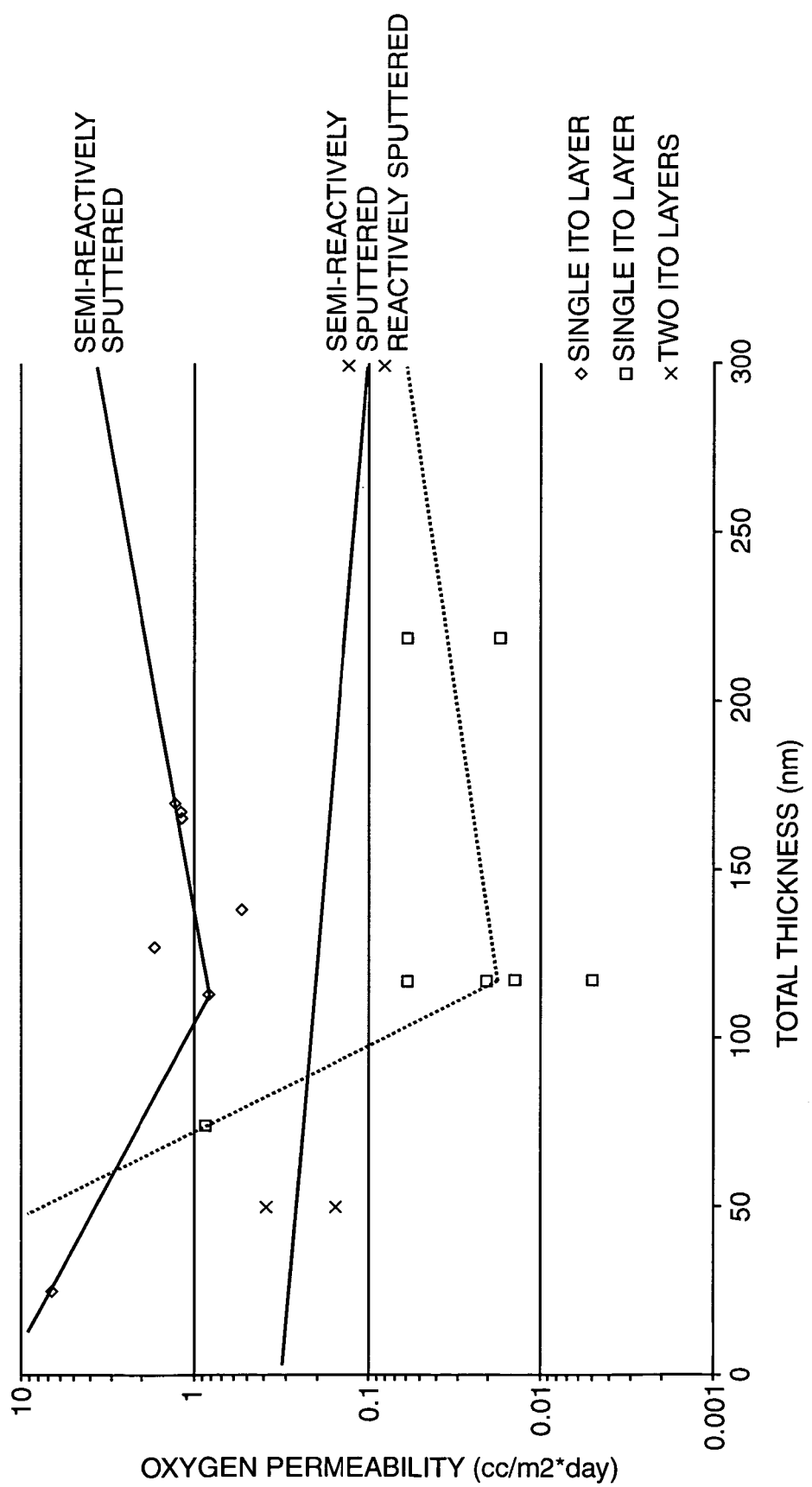
FIG. 19 is a chart showing oxygen permeability of ITO films deposited on a PET substrate versus ITO film thickness.
Figure 20:
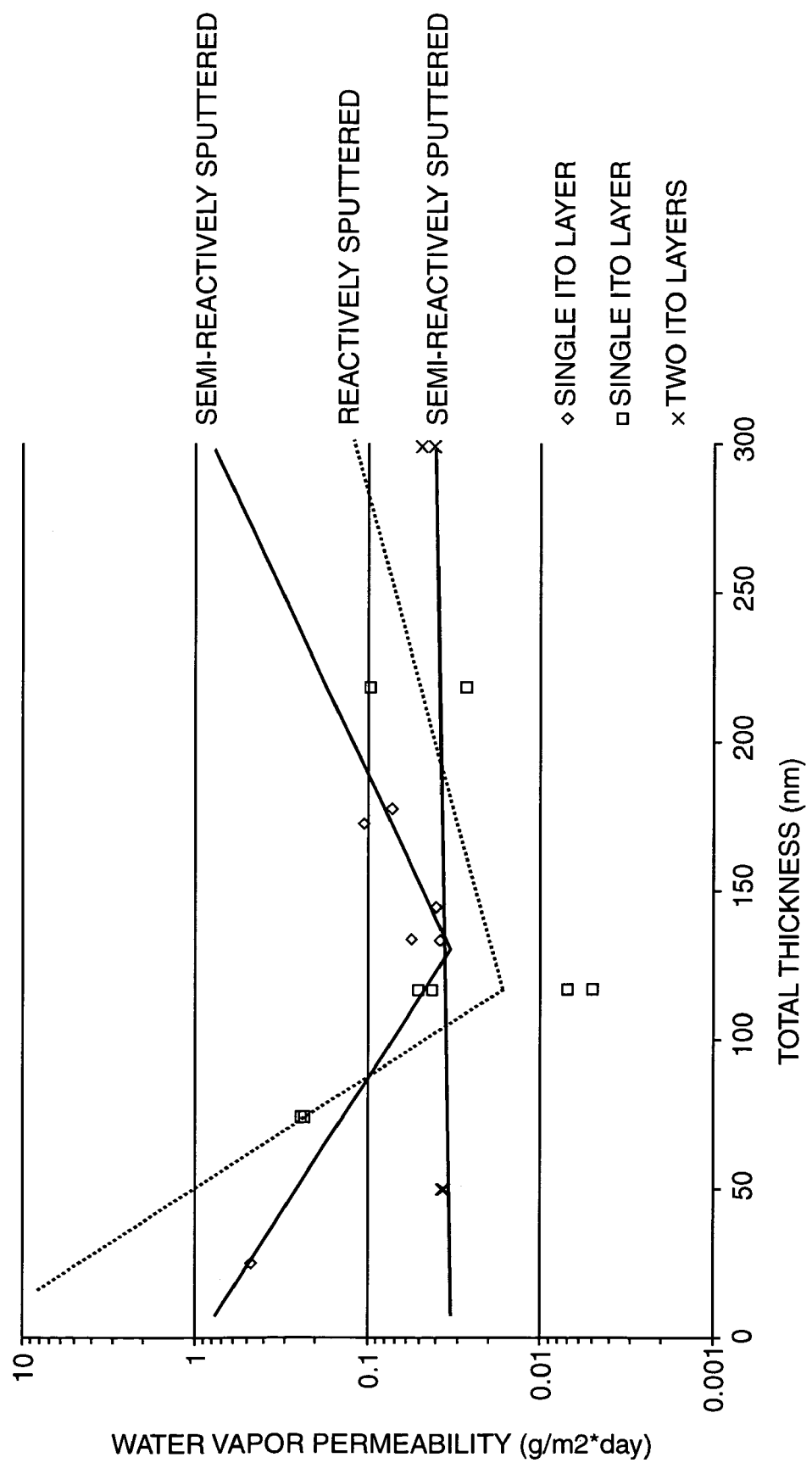
FIG. 20 is a chart showing water vapor permeability of ITO films deposited on a PET substrate versus ITO film thickness.

The measured results for semi-reactively and reactively sputtered ITO, as well as the differences between a single ITO layer and two ITO layers (with a polymer layer in between the two layers) made with a semi-reactive process, are illustrated in FIG. 19 and FIG. 20. "Semi-reactively sputtered" refers to films, DC magnetron sputtered from a ceramic target.

The preferred thickness for ITO is different for conductivity and barrier properties. The film thickness must be greater to have conductive properties. Also, if the layer is too thin it will not have barrier properties. The critical thickness for these layers varies with the material and how the layers are deposited. For ITO, the critical minimal thickness is about 10 nanometers (or 100 angstroms). The lower limits for some of the metal oxides are about 10 to 30 nanometers in packaging. Generally, 5–10 nanometers is the minimum thickness required for adequate barrier properties, however, the film needs to be thicker for conductivity properties (20 nanometers to 300 nanometers). If thicker than that range, then the film starts cracking, and hence, loses conductivity. For maximizing optical transmission, it is well known that optical thicknesses of thin films can be selected. The typical physical thickness is 20–300 nanometers for ITO on a flexible substrate.

Figure 21:
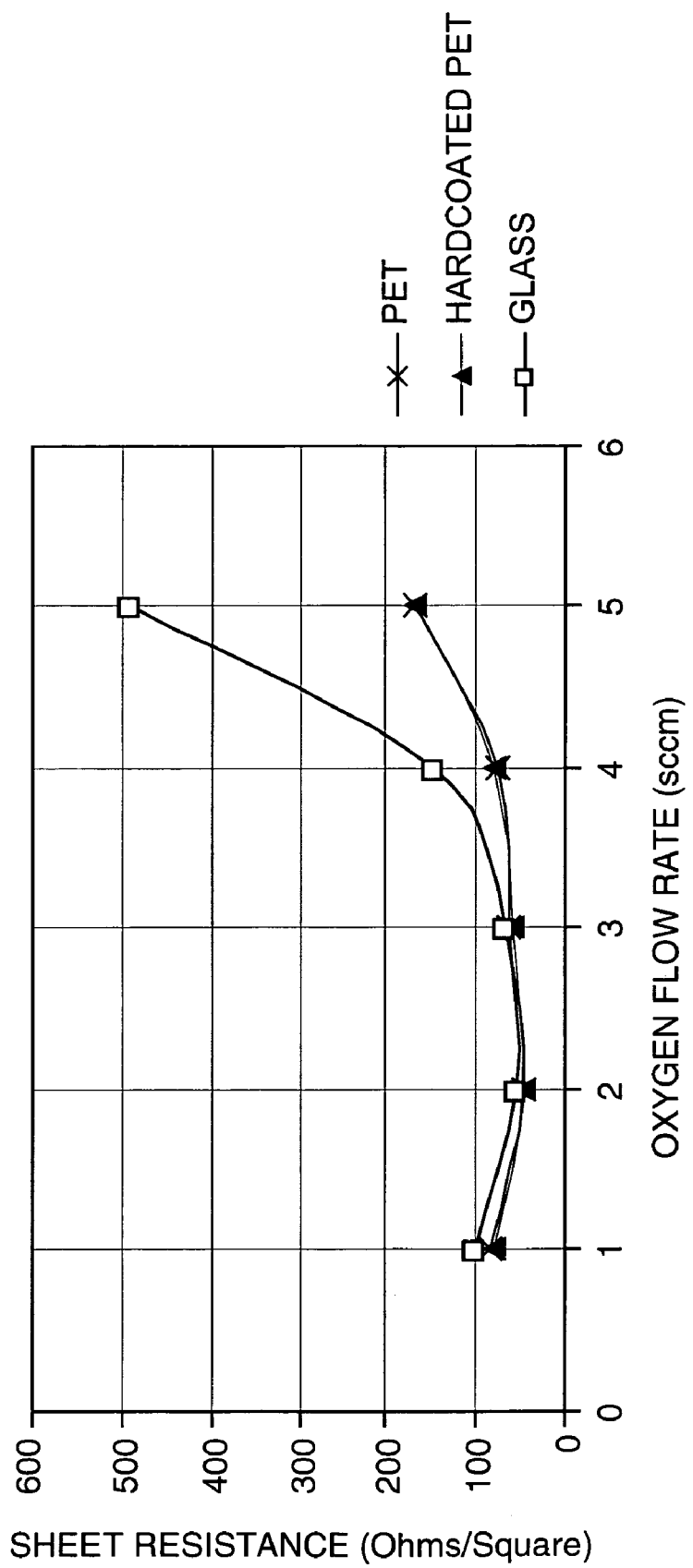
FIG. 21 is a chart showing sheet resistance of various substrates versus oxygen flow rate through the respective substrate.
Figure 22:
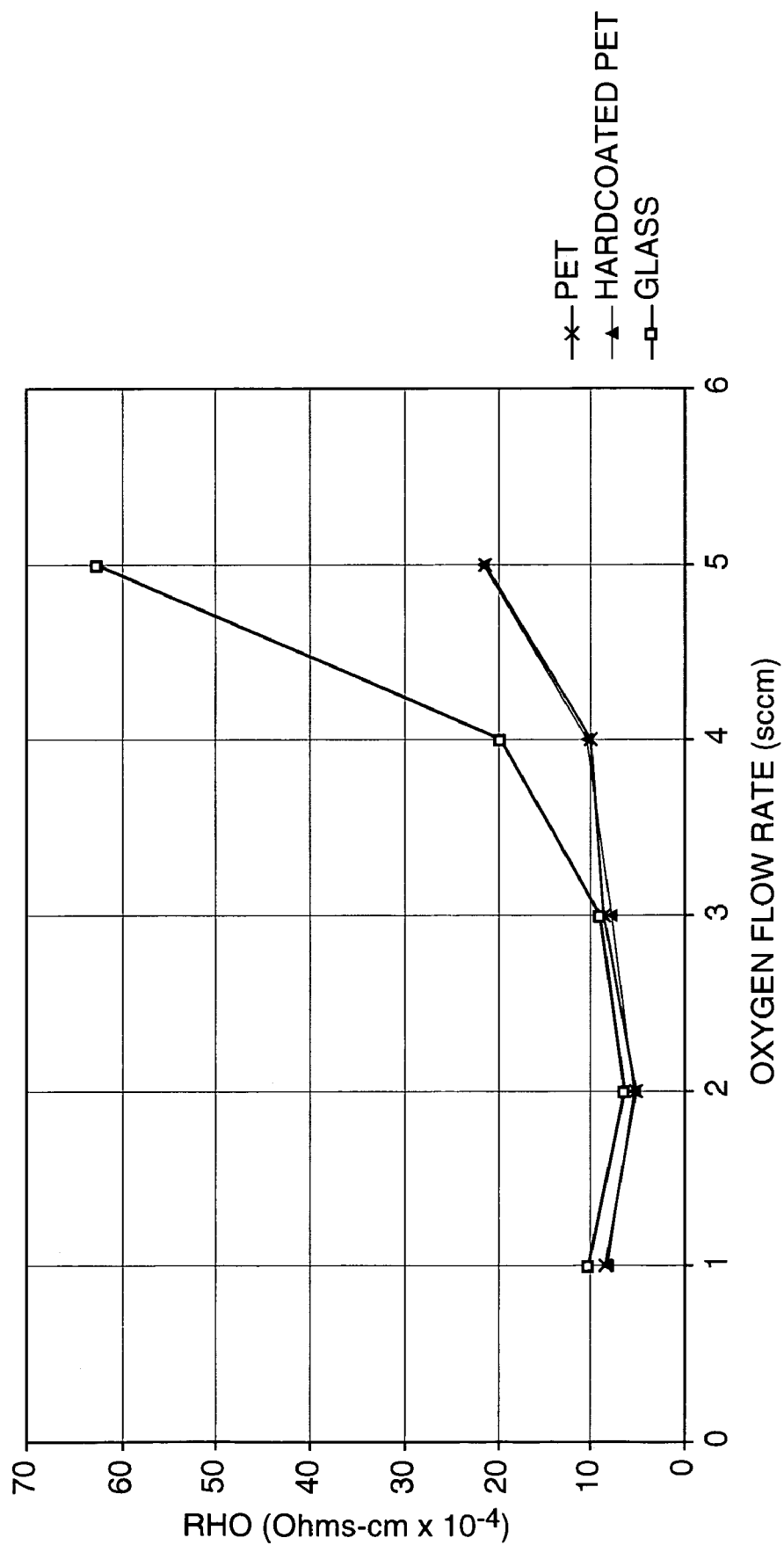
FIG. 22 is a chart showing resistivity of various substrates versus oxygen flow rate through the respective substrate.

FIG. 21 and FIG. 22 show that PET substrates have lower sheet resistance and resistivity for the same oxygen flow rates than a glass substrate. FIG. 21 discloses a chart showing sheet resistance of various substrates versus oxygen flow rate through the respective substrate. Substrates of PET, hardcoated PET (a PET coated with a base coat that is liquid smoothed/atmospheric coated for surface abrasion resistance), and glass were compared. Glass has the highest sheet resistance, especially at oxygen flow rates over 3 sccm (standard cubic centimeters per minute). The chart shows that the glass sheet resistance reached approximately 500 ohm/square at an oxygen flow rate of 5 sccm. At the same oxygen flow rate, PET and hardcoated PET have approximately the same sheet resistance. The least sheet resistance (35 ohms/square) for the PET substrates is at an oxygen flow rate of 2 sccm, while the highest sheet resistance (170 ohms/square) is at an oxygen flow rate of 5 sccm. FIG. 22 shows similar results for resistivity.

Figure 23:
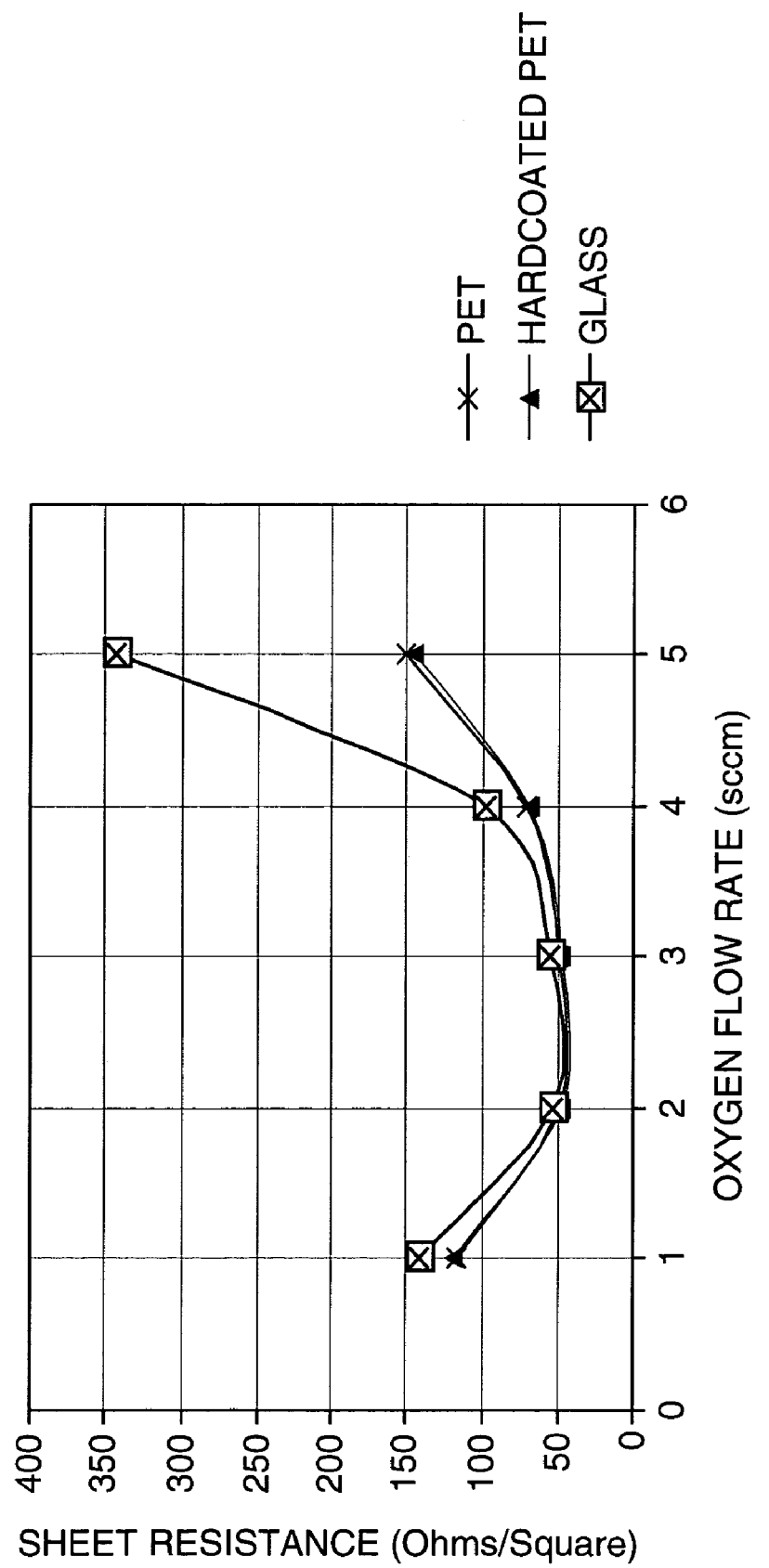
FIG. 23 is a chart showing sheet resistance of various substrates versus oxygen flow rate through the respective substrate for 7.5% hydrogen in the plasma.
Figure 24:
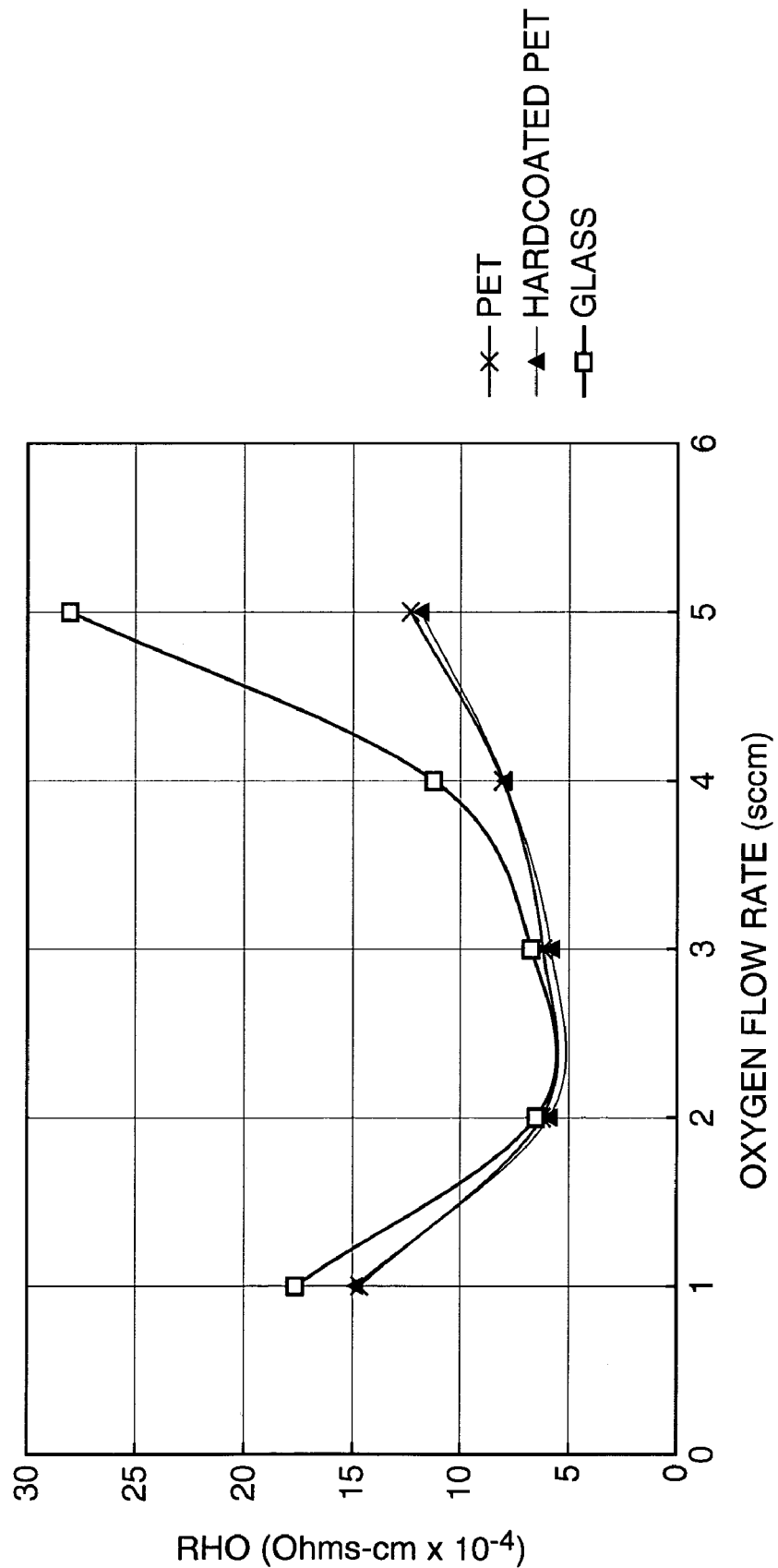
FIG. 24 is a chart showing resistivity of various substrates versus oxygen flow rate through the respective substrate for 7.5% hydrogen in the plasma.

FIG. 23 and FIG. 24 disclose charts showing sheet resistance and resistivity, respectively, of various substrates versus oxygen flow rate through the respective substrate, where 7.5% of the plasma used in the sputtering process is hydrogen gas. Substrates of PET, hardcoated PET, and glass were compared. Again, glass has higher sheet resistance and resistivity, especially at oxygen flow rates over 3 sccm. The chart shows that at an oxygen flow rate of 5 sccm, the glass sheet resistance reached approximately 350 ohms/square and a resistivity of approximately 27 ohm-cm×$10^{-4}$. PET and hardcoated PET have approximately the same sheet resistance and resistivity for the same oxygen flow rate. The least sheet resistance (40 ohms/square) for these PET substrates is at an oxygen flow rate of approximately 2.3 sccm, while the highest sheet resistance (150 ohms/square) is at an oxygen flow rate of 5 sccm.

Figure 25:
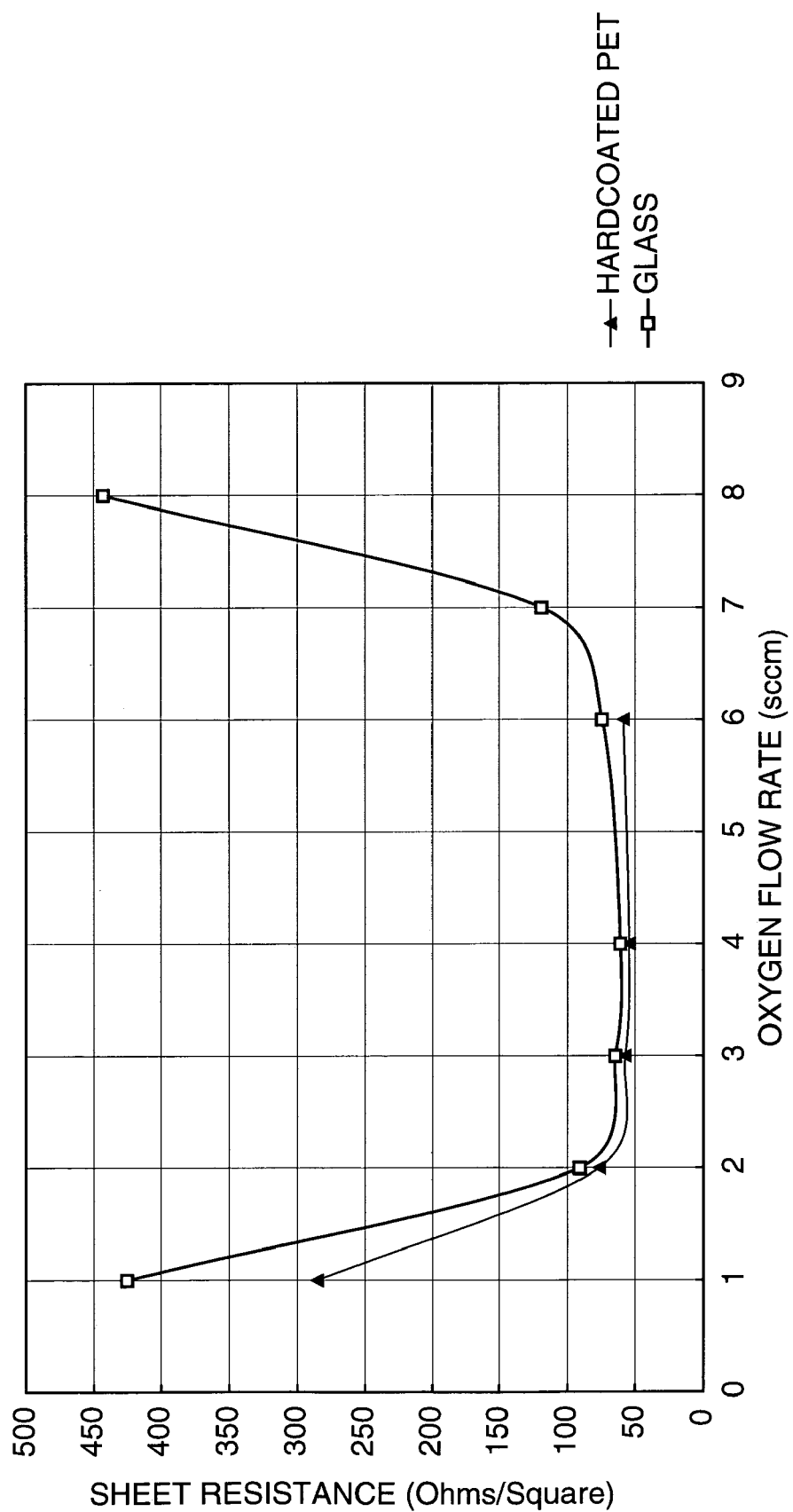
FIG. 25 is a chart showing sheet resistance of various substrates versus oxygen flow rate through the respective substrate for 20% hydrogen in the plasma.
Figure 26:
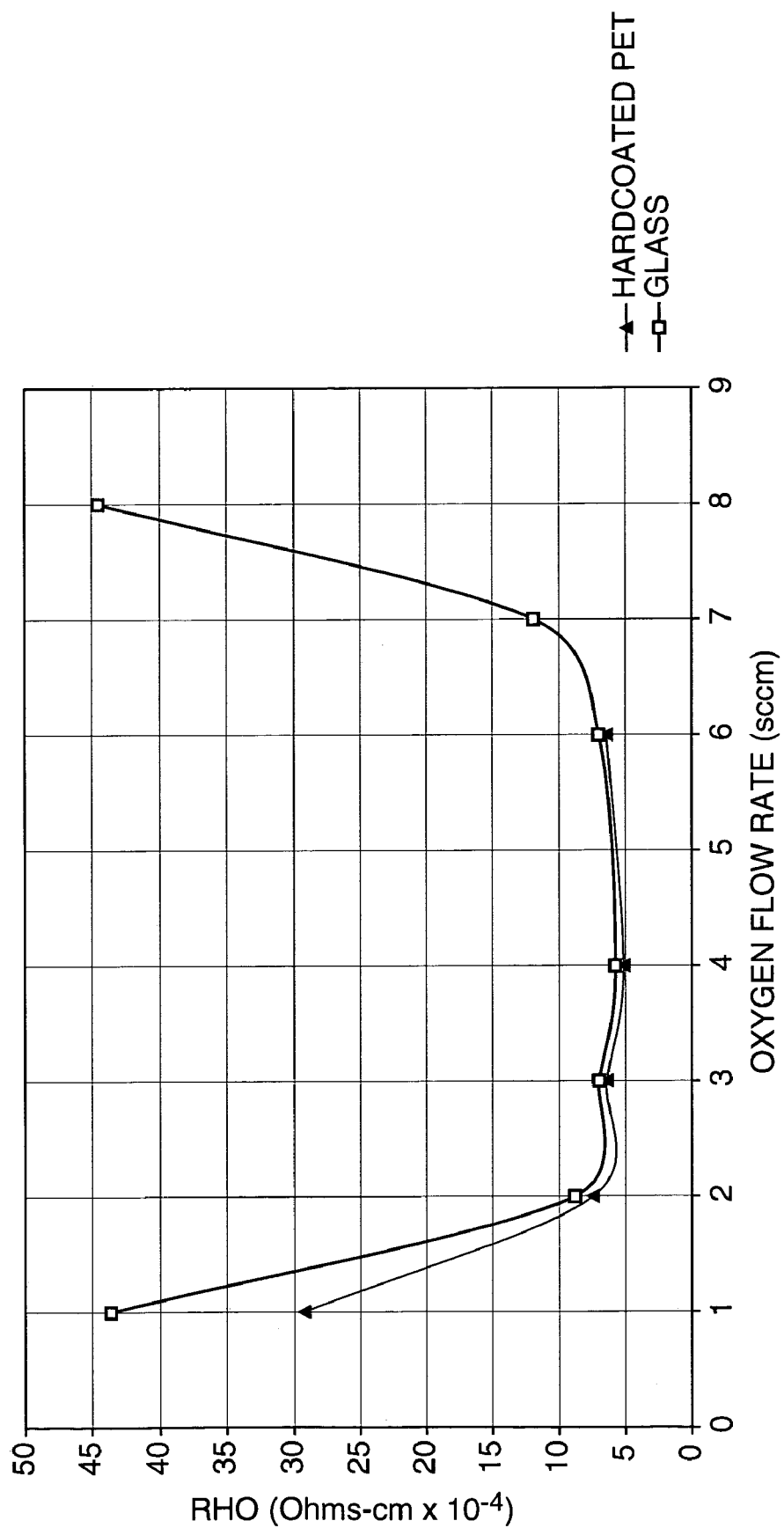
FIG. 26 is a chart showing resistivity of various substrates versus oxygen flow rate through the respective substrate for 20% hydrogen in the plasma.

FIG. 25 and FIG. 26 disclose charts showing sheet resistance and resistivity, respectively, of various substrates versus oxygen flow rate through the respective substrate, where 20% of the plasma used in the sputtering process is hydrogen gas. Substrates of hardcoated PET and glass were compared. Again, glass has higher sheet resistance and resistivity, especially at oxygen flow rates below 2 sccm and over 5–6 sccm. The oxygen flow rate for the hardcoated PET substrate did not exceed 6 sccm. Generally, the sheet resistance and resistivity are significantly lower for the increased percentage of hydrogen in the plasma, for oxygen flow rates above 3 sccm.

Figure 27:
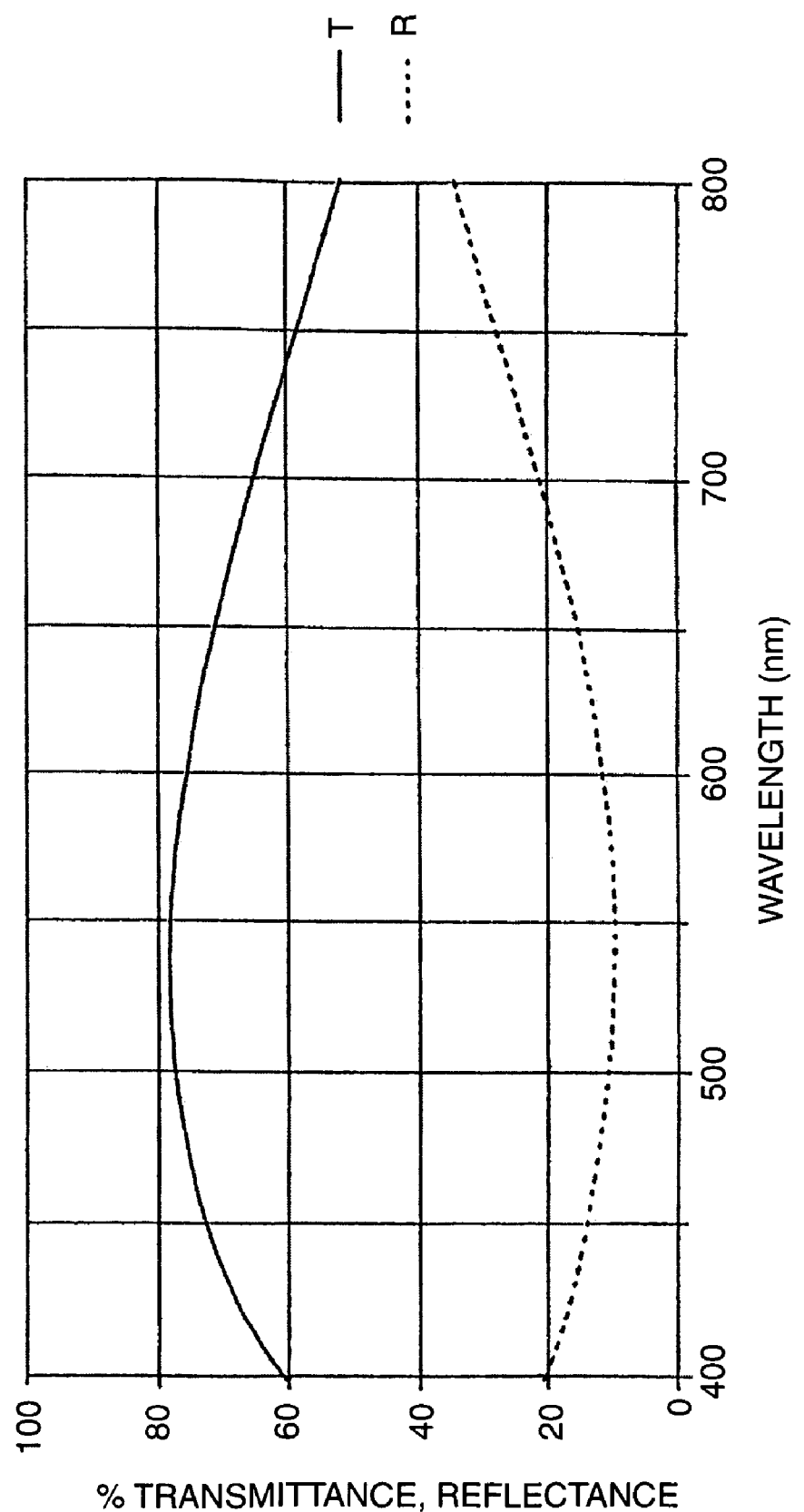
FIG. 27 is a chart showing transmittance and reflectance spectra (for an ITO layer over a silver film layer over an ITO layer over a PET substrate at a sheet resistance of 14 Ohms/Square) versus wavelength.
Figure 28:
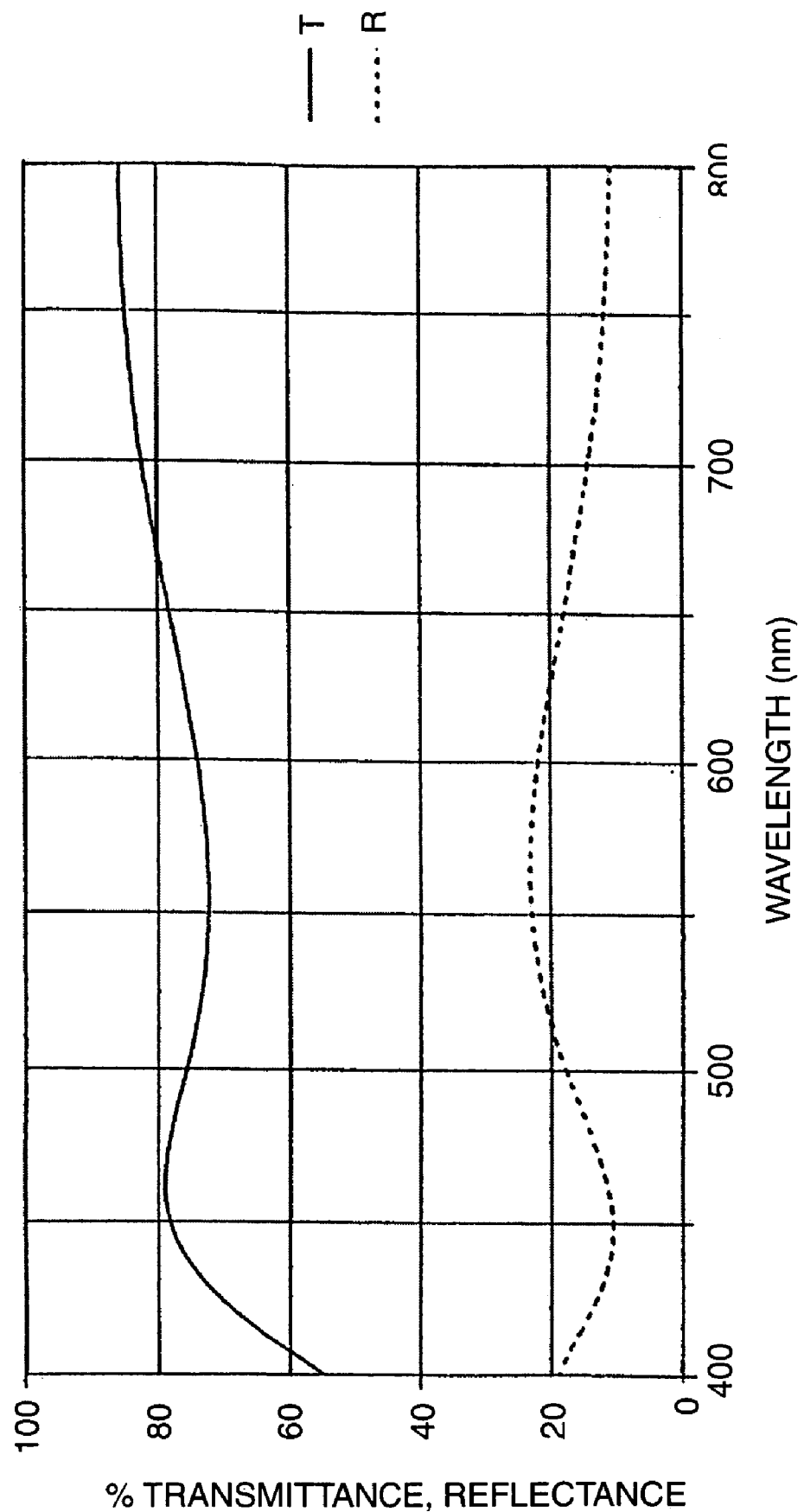
FIG. 28 is a chart showing transmittance and reflectance spectra (for an ITO layer over a PET substrate at a sheet resistance of 29 Ohms/Square) versus wavelength.
Figure 29:
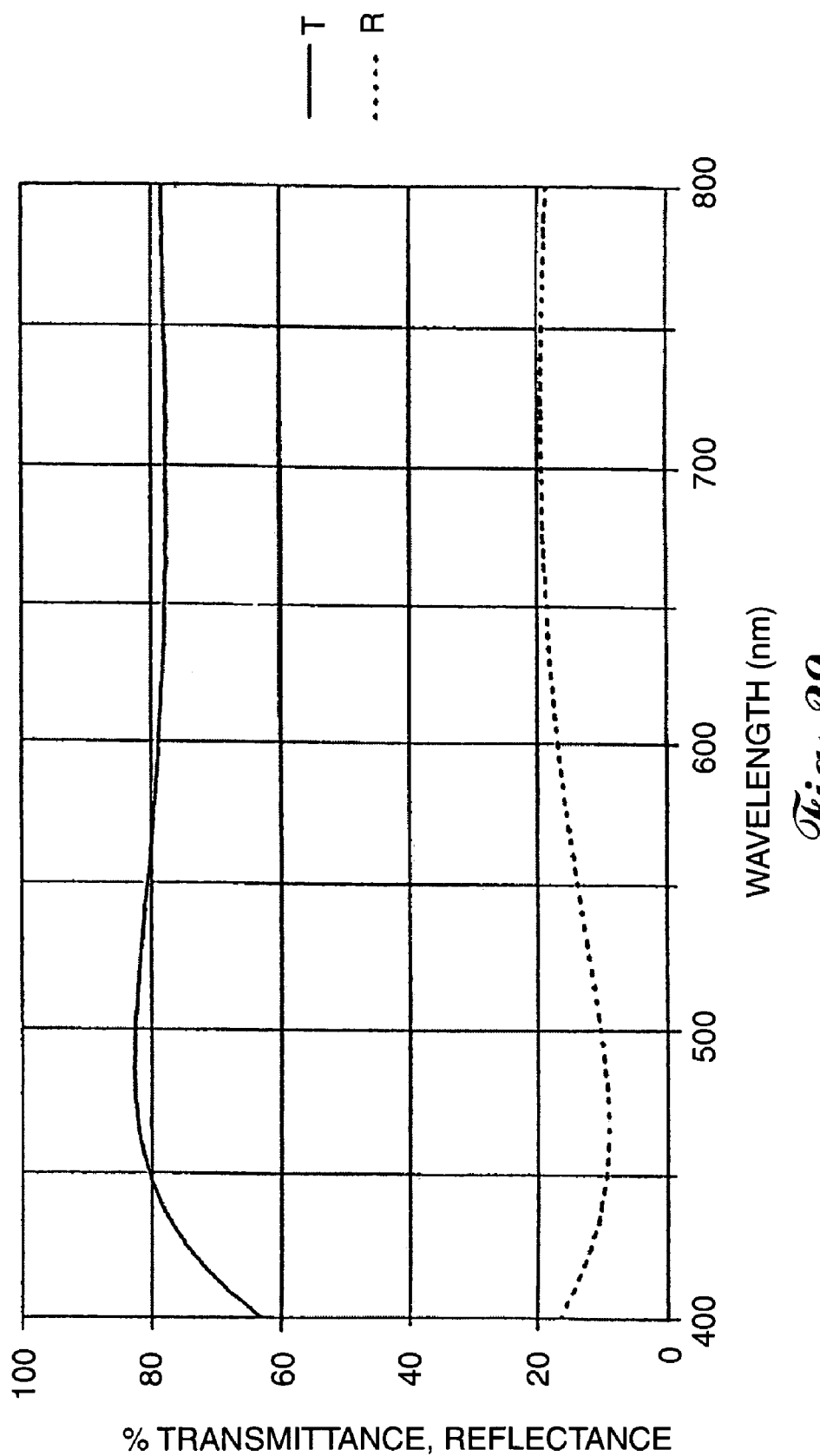
FIG. 29 is a chart showing transmittance and reflectance spectra (for an ITO layer over a PET substrate at a sheet resistance of 57 Ohms/Square) versus wavelength.
Figure 30:
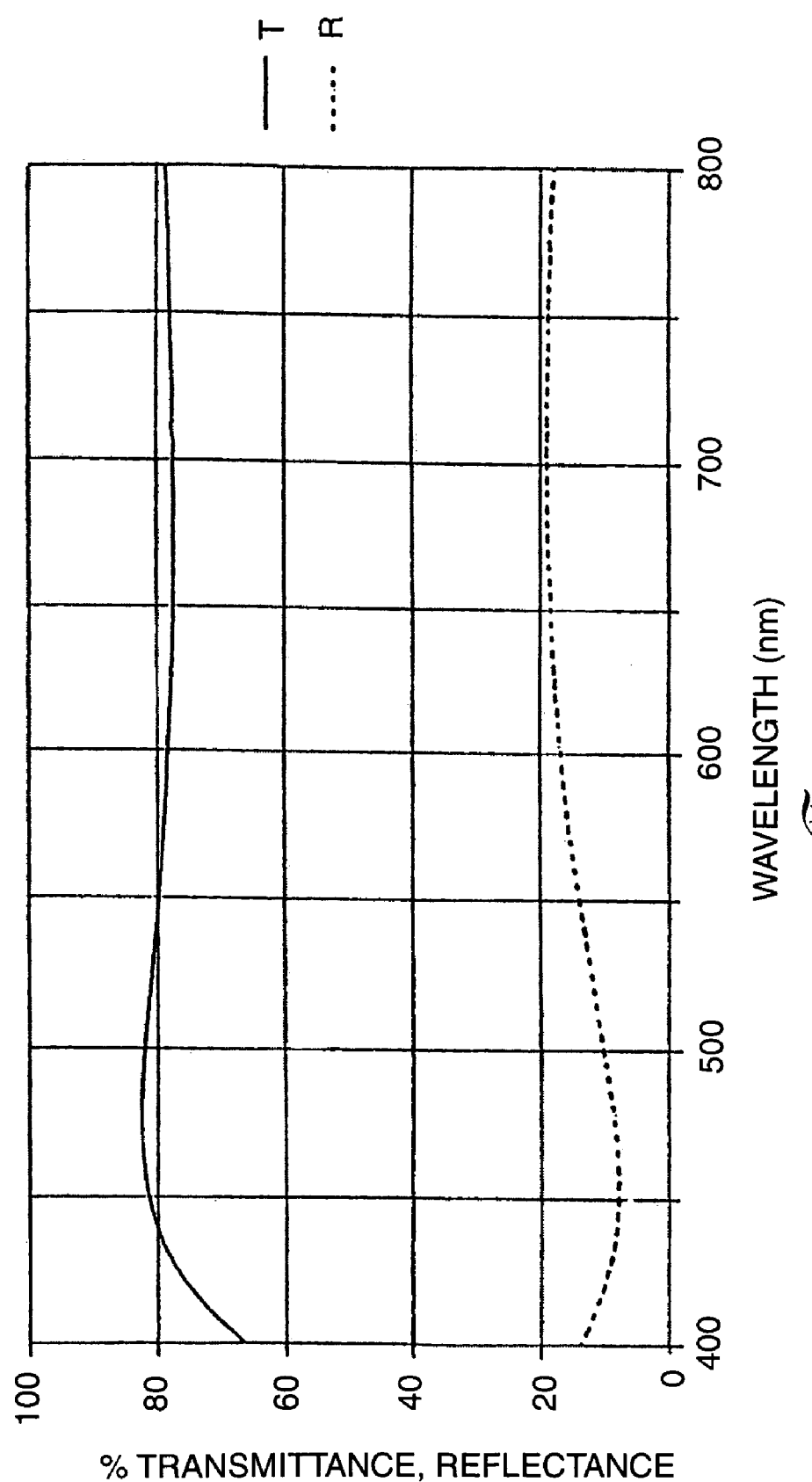
FIG. 30 is a chart showing transmittance and reflectance spectra (for an ITO layer over a PET substrate at a sheet resistance of 65 Ohms/Square) versus wavelength.
Figure 31:
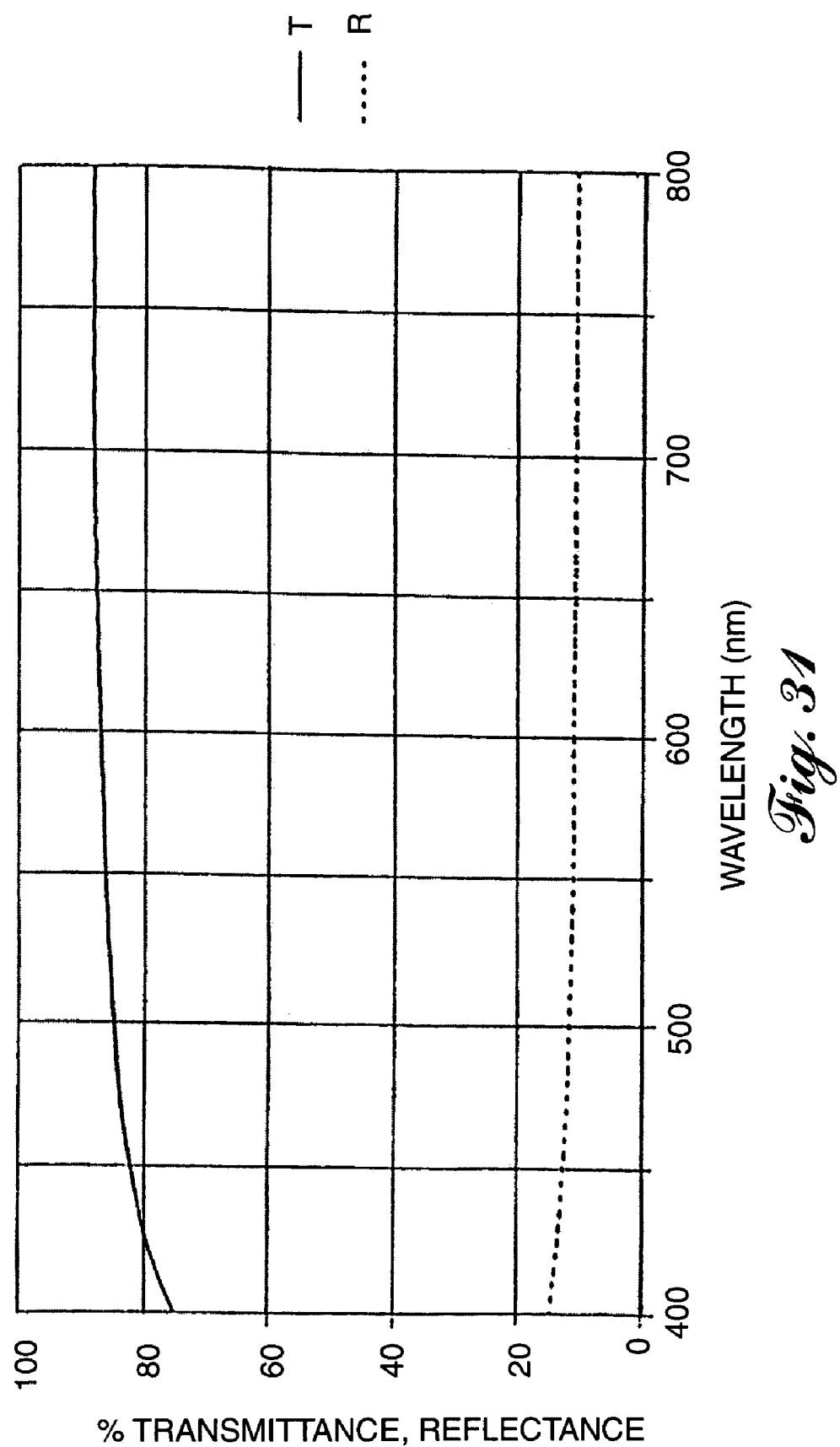
FIG. 31 is a chart showing transmittance and reflectance spectra (for an ITO layer over a PET substrate at a sheet resistance of 347 Ohms/Square) versus wavelength.

FIG. 27 is a chart showing transmittance and reflectance spectra versus wavelength for a more preferred embodiment of the present invention. FIG. 27 shows the transmittance spectra for a PET substrate coated with layers of ITO, silver film, and ITO at a sheet resistance of 14 Ohms/Square. FIG. 28 through FIG. 31 are charts showing transmittance and reflectance spectra versus wavelength for an ITO layer deposited over a PET substrate at a sheet resistance of 29 Ohms/Square, 57 Ohms/Square, 65 Ohms/Square, and 347 Ohms/Square, respectively. As shown, generally, for a range of sheet resistances the percentage of spectral transmittance and reflectance remains relatively constant. For example, at about a wavelength of 500 nm, the transmittance percentage is about 80% for resistance ranging from 29 ohms/square to 347 ohms/square. DC sputter deposited ITO on a hardcoated PET substrate exhibited a surface resistivity of 46.9 Ohms/square, which is a volume resistivity of approximately 5×$10^{-4}$ Ohm-cm, and a visible transmittance of about 84.7%. Generally, the transmittance increases (and the reflectance decreases) as the plasma wavelength increases. There is always a compromise between high optical transmittance and high conductivity. In contrast to FIG. 28 through FIG. 31, in FIG. 27 the transmittance decreases and the reflectance increases at the higher wavelengths.

Figure 32:
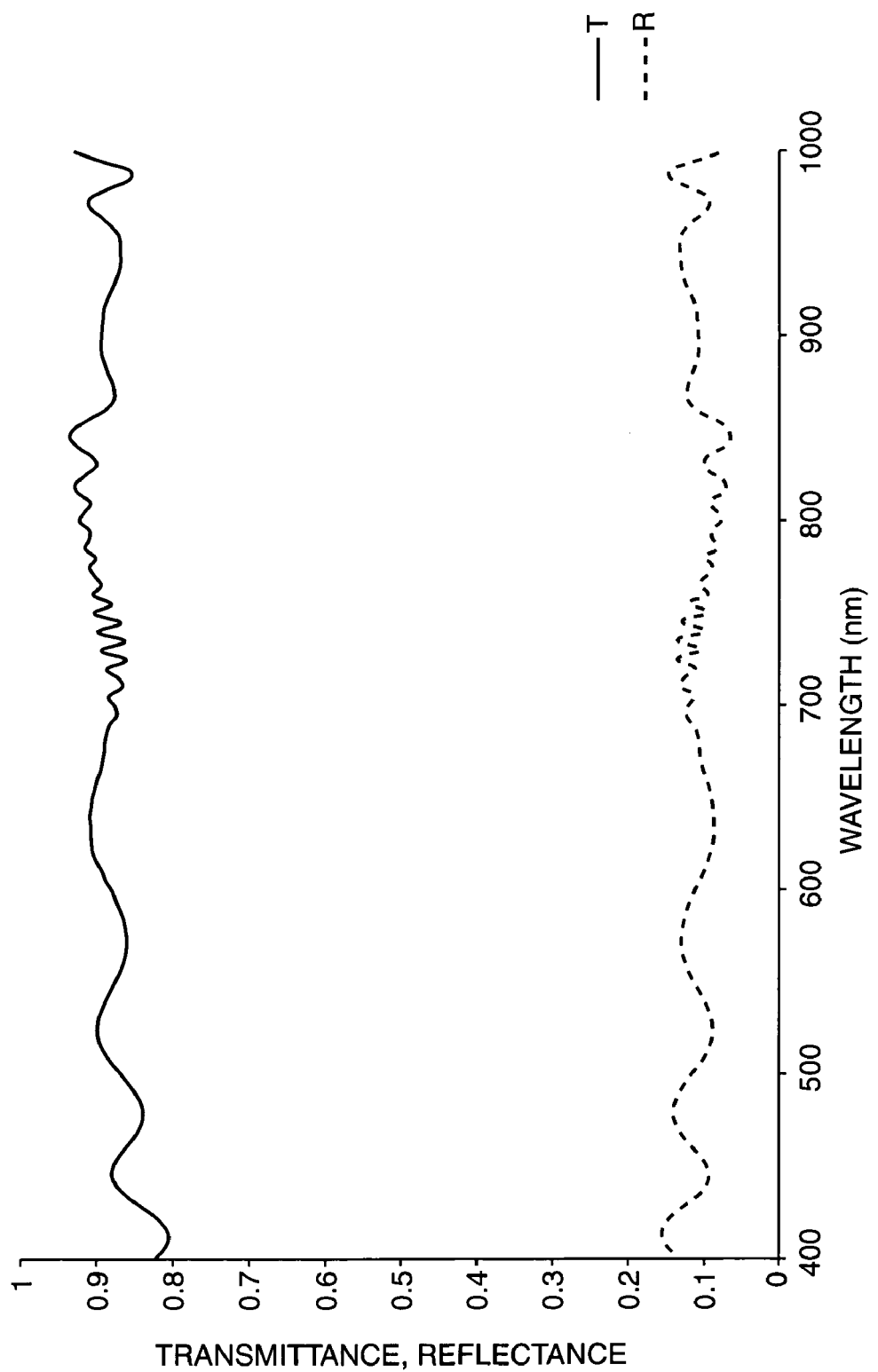
FIG. 32 is a chart showing transmittance and reflectance spectra (for a 25 nm thick semi-reactively sputtered ITO layer over a polymer layer on a PET substrate) versus wavelength.
Figure 33:
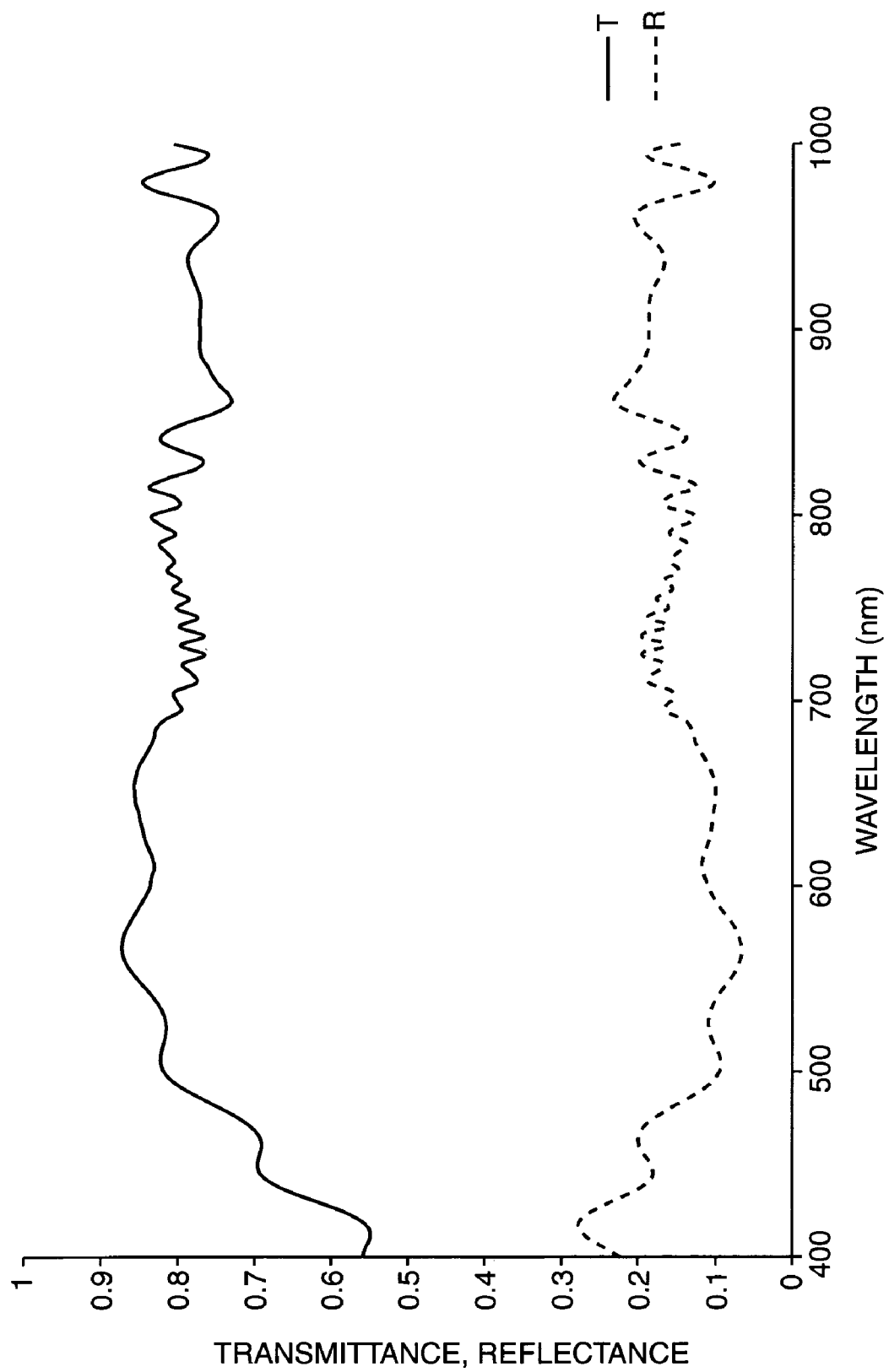
FIG. 33 is a chart showing transmittance and reflectance spectra (for a 153 nm thick semi-reactively sputtered ITO layer over a polymer layer on a PET substrate) versus wavelength.
Figure 34:
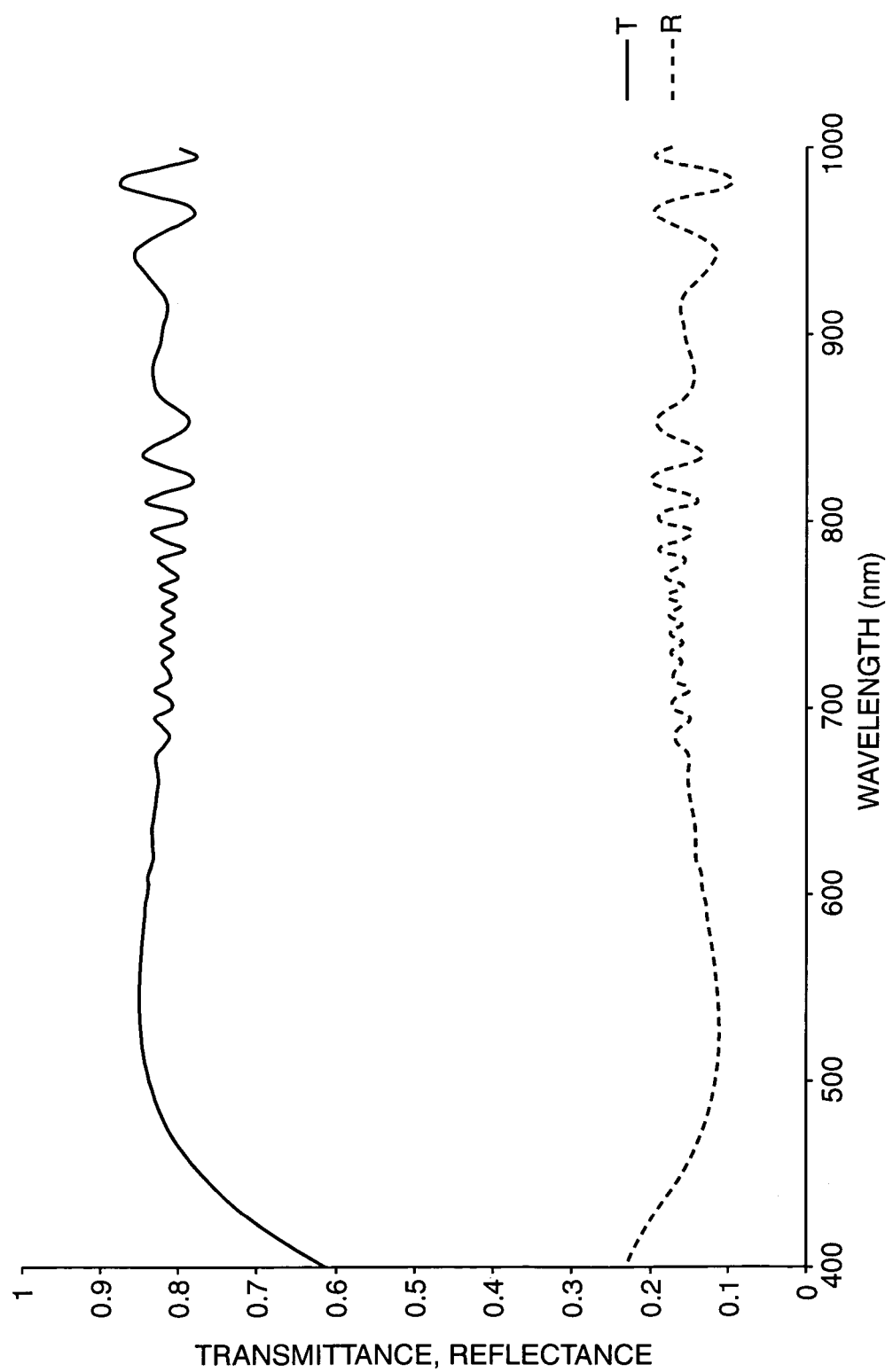
FIG. 34 is a chart showing transmittance and reflectance spectra (for a 134 nm thick semi-reactively sputtered ITO layer on a PET substrate) versus wavelength.
Figure 35:
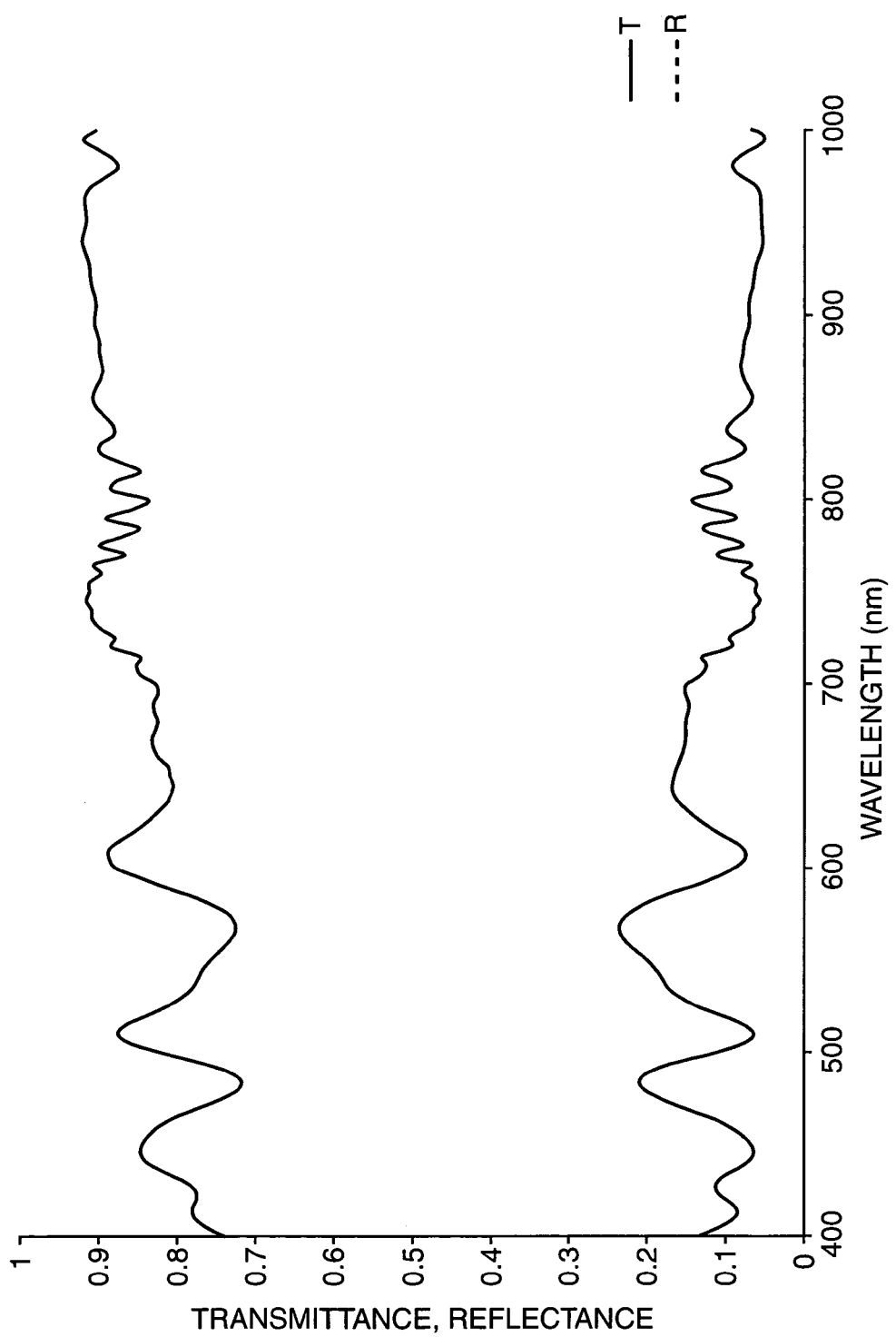
FIG. 35 is a chart showing transmittance and reflectance spectra (for a 50 nm total ITO thickness barrier coating of semi-reactively sputtered ITO/polymer/semi-reactively sputtered ITO/polymer on a PET substrate) versus wavelength.
Figure 36:
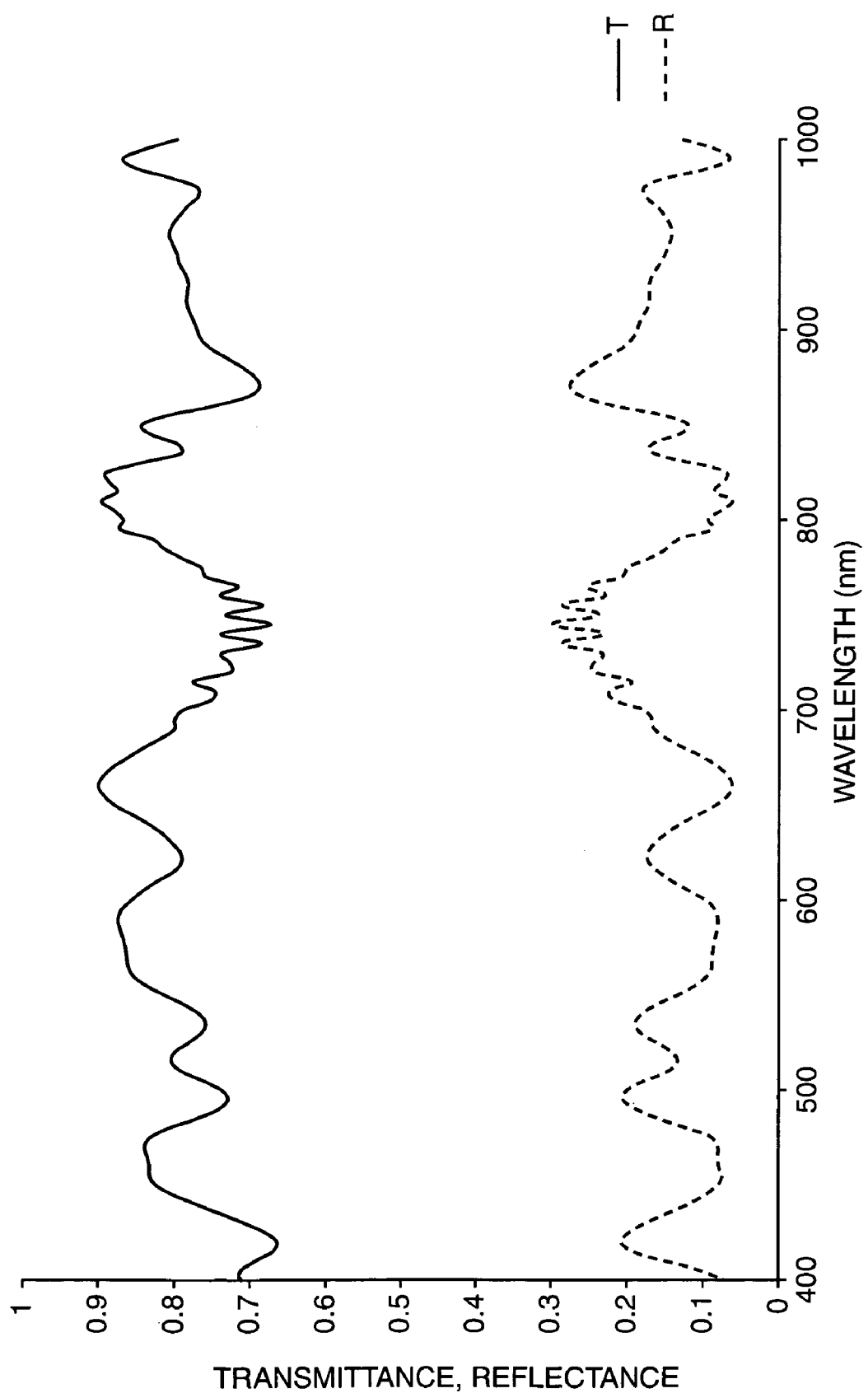
FIG. 36 is a chart showing transmittance and reflectance spectra (for a 299 nm total ITO thickness barrier coating of semi-reactively sputtered ITO/polymer/semi-reactively sputtered ITO/polymer on a PET substrate) versus wavelength.

FIG. 32 through FIG. 36 illustrate transmittance and reflectance of semi-reactively sputtered ITO on a PET substrate for various thicknesses versus wavelength. The transmittance and reflectance of substrates coated with a polymer layer and an ITO layer are illustrated in FIG. 32 and FIG. 33. The transmittance and reflectance of a substrate coated with an ITO layer is illustrated in FIG. 34. The transmittance and reflectance of substrates coated with two ITO layers (with a polymer layer in between the two ITO layers) are illustrated in FIG. 35 and FIG. 36. Generally, transmittance and conductivity are inversely related.

For a transparent electrode, conductivity requirements vary with display technology and addressing method. The surface resistivity for LCDs is about 50–300 Ohms/square, and for OLEDs is about 10–100 Ohms/square. The corresponding visible transmittance for LCDs is about 90%, and for OLEDs is about 80–85%. The thickness of the conductor layer is compatible with the web processing for the flexible plastic substrate.

Table 1 shows the test results for oxygen and water vapor transmission rates of various samples of a PET substrate coated with a single ITO layer with different Ohms/square coatings and a substrate coated with an ITO layer, a metal layer, and another ITO layer. The test conditions were as follows: the temperature was at 23° C./73.4° F. On each side of the barrier for the oxygen transmission rate tests, the relative humidity was 0%. On one side of the barrier for the water vapor transmission rate tests, the relative humidity was 100%, but the other side of the barrier had a relative humidity of 0%.

The first eight samples of Table 1 are of a plastic substrate coated with a single ITO film layer, each with different ITO thickness and sheet resistances. For example, "25-1" is the first sample with a sheet resistance of 25 Ohm/square; whereas "25-2" is the second sample from the same lot. The last two samples are of a substrate coated with an ITO layer, a metal coating, and another ITO layer, with a nominal sheet resistance of 10 Ohm/square. This 3 layer configuration is the "optically enhanced metal" and has similar characteristics to a single TCO layer. With the optically enhanced metal, good conductivity, transmission and barrier properties are achieved. Preferably the ITO layer has a thickness of about 50–60 nanometers. In several instances, the samples were tested two times. For example, the second column for the 25 and 60 Ohms/square samples reflects the results of the second test.

TABLE 1

| Sample | Water Vapor Transmission Rate (g/m$^2$day) | | Oxygen Transmission Rate (cc/m$^2$day) | |
|---|---|---|---|---|
| 25-1 | 0.026 | <0.005[1] | 0.017 | 0.087 |
| 25-2 | 0.097 | <0.005[1] | 0.584 | 0.257 |
| 60-1 | 0.042 | | 0.059 | 0.071 |
| 60-2 | 0.050 | | 0.204 | 0.090 |
| 60-3 | 0.007 | | <0.005[2] | |
| 60-4 | <0.005[1] | | 0.014 | |
| 300-1 | 0.243 | | 0.861 | |
| 300-2 | 0.232 | | 0.864 | |
| M-10-1 | 0.076 | | 0.035 | |
| M-10-2 | 0.041 | | 0.024 | |

[1]The actual water vapor transmission rate was at least as low as the lower limit of the instrument, Permatran-W 3/31, 0.005 g/m$^2$day.
[2]The actual oxygen transmission rate was at least as low as the lower limit of the instrument, Ox-Tran 2/20, 0.005 cc/m$^2$day.

Table 2 compares permeation rates for different coatings, including multiple dyad (an acrylate/oxide pair) layers on the PET substrate, and coatings on oriented polypropylene (OPP) substrates. As shown, a single dyad on a substrate has high oxygen and moisture permeation resistance. In some instances, two oxygen transmission rate tests were conducted, and the results were shown in a second column. The first row provides typical permeation rates for the PET substrate.

TABLE 2

| Sample | Water Vapor Transmission Rate (g/m$^2$day) | Oxygen Transmission Rate (cc/m$^2$day) |
|---|---|---|
| 2 mil PET | 5.3 (272 per micron film thickness | 30.5 (1550 per micron film thickness |
| Food packaging-target values (PET/oxide) | 1.5 | 1.55 |
| 2 mil PET/single dyad | 0.03 | <0.0078 |

TABLE 2-continued

| Sample | Water Vapor Transmission Rate (g/m²day) | | Oxygen Transmission Rate (cc/m²day) |
|---|---|---|---|
| (23° C.) | | | |
| 2 mil PET/seven dyads (23° C.) | <0.016 | | <0.0078 |
| 7 mil PET/hardcoat (23° C.) | — | | 7.6 |
| 7 mil PET/hardcoat/ single dyad (38° C.) | 0.2682, 100% RH | 0.6061, 100% RH | <0.0078, 90% Relative Humidity (RH), 100% O$_2$ |
| 7 mil PET/hardcoat/ single dyad/ITO (38° C.) | 0.0098, 100% RH | 0.0128, 100% RH | <0.0078, 90% RH, 100% O$_2$ |
| PET/oxide | 0.15–0.9 | | 0.7–1.5 |
| PET/Aluminum | 0.17 | | 0.6 |
| OPP, copolymer, 1 mil | 1.3 | | 1800 |
| OPP/oxide | 0.08–0.4 | | 17–546 |
| OPP/Aluminum | 0.11 | | 20 |

Although the present invention has been described and is illustrated with respect to various embodiments thereof, it is to be understood that it is not to be so limited, because changes and modifications may be made therein which are within the full intended scope of this invention as hereinafter claimed. In particular, the structure disclosed in the present invention for flat panel displays can also be used with other display technologies, such as polymer light emitting diode (PLED) and light emitting diode (LED) displays.

The invention claimed is:

1. An electronic device on a plastic substrate, at least one side of the device being protected from reaction with or incorporation of moisture by a composite barrier comprising multiple layers of transparent conductive oxide separated by one or more vacuum-deposited in-situ polymerized organic layers.

2. A device according to claim 1 wherein the transparent conductive oxide comprises an indium tin oxide.

3. A device according to claim 1 further comprising an acrylic hardcoat.

4. A device according to claim 1 wherein a layer of the transparent conductive oxide has a sheet resistance less than 150 ohms/square.

5. A device according to claim 1 wherein the device comprises a light emissive device.

6. A device according to claim 1 wherein the device has at least two sides each of which is protected by such a composite barrier.

* * * * *

UNITED STATES PATENT AND TRADEMARK OFFICE
CERTIFICATE OF CORRECTION

| | | |
|---|---|---|
| PATENT NO. | : 7,186,465 B2 | |
| APPLICATION NO. | : 09/939008 | |
| DATED | : March 6, 2007 | |
| INVENTOR(S) | : Clark I. Bright | |

It is certified that error appears in the above-identified patent and that said Letters Patent is hereby corrected as shown below:

Title Page,
Item (56), References Cited, OTHER PUBLICATIONS, Page 2, Col. 2, Line 21, delete "Technolgy" and insert in place thereof -- Technology --.
Item (56), References Cited, OTHER PUBLICATIONS, Page 3, Col. 1, Line 11, delete "Mc-Graw" and insert in place thereof -- McGraw --.
Item (56), References Cited, OTHER PUBLICATIONS, Page 3, Col. 2, Line 18, delete "y," and insert in place thereof -- Y. --.
Item (56), References Cited, OTHER PUBLICATIONS, Page 3, Col. 2, Line 22, delete "Combinations" and insert in place thereof -- Combinatorial --.
Item (56), References Cited, OTHER PUBLICATIONS, Page 3, Col. 2, Line 61, delete "Depostion" and insert in place thereof -- Deposition --.
Item (56), References Cited, OTHER PUBLICATIONS, Page 4, Col. 1, Line 1, delete "et al.m" and insert in place thereof -- et al., --.
Item (56), References Cited, OTHER PUBLICATIONS, Page 4, Col. 1, Line 2, delete "FT97" and insert in place thereof -- FY97 --.
Item (56), References Cited, OTHER PUBLICATIONS, Page 4, Col. 1, Line 16, delete "Barriers" and insert in place thereof -- Barrier --.
Item (56), References Cited, OTHER PUBLICATIONS, Page 4, Col. 1, Line 19, delete "Norhtwest" and insert in place thereof -- Northwest --.

Column 16,
Line 42, delete "instrument, Permatran-W 3/31," and insert in place thereof
-- PERMATRAN-W 3/31 instrument, --.
Line 44, delete "instrument, Ox-tran 2/20," and insert in place thereof -- OX-TRAN 2/20 instrument, --.

UNITED STATES PATENT AND TRADEMARK OFFICE
CERTIFICATE OF CORRECTION

PATENT NO.         : 7,186,465 B2
APPLICATION NO. : 09/939008
DATED                 : March 6, 2007
INVENTOR(S)       : Clark I. Bright It is certified that error appears in the above-identified patent and that said Letters Patent is hereby corrected as shown below:

Column 16, (Continued)
TABLE 2, Line 63, delete "thickness" (both instances) and insert in place thereof
-- thickness) -- (both instances).

Signed and Sealed this

Fifteenth Day of April, 2008

JON W. DUDAS
*Director of the United States Patent and Trademark Office*